US 6,554,906 B1

(12) United States Patent
Kuibira et al.

(10) Patent No.: US 6,554,906 B1
(45) Date of Patent: Apr. 29, 2003

(54) WAFER HOLDER FOR SEMICONDUCTOR MANUFACTURING APPARATUS AND SEMICONDUCTOR MANUFACTURING APPARATUS USING THE SAME

(75) Inventors: Akira Kuibira, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 157 days.

(21) Appl. No.: 09/707,813

(22) Filed: Nov. 7, 2000

(30) Foreign Application Priority Data

Jan. 20, 2000 (JP) .......................... 2000-012170
May 30, 2000 (JP) .......................... 2000-160366

(51) Int. Cl.$^7$ .......................... M01L 21/00; C23C 16/00
(52) U.S. Cl. .......................... 118/725; 118/728; 118/715; 118/500; 156/345.52; 361/234
(58) Field of Search .......................... 156/345.51, 345.52; 118/715–733; 361/234

(56) References Cited

U.S. PATENT DOCUMENTS 5,855,687 A * 1/1999 DuBois et al. .............. 118/500
5,904,872 A * 5/1999 Arami et al. .............. 219/444.1
5,997,651 A * 12/1999 Matsuse et al. .............. 118/715
6,080,969 A * 6/2000 Goto et al. .............. 118/724
6,204,489 B1 * 3/2001 Katsuda et al. .............. 118/725
6,423,949 B1 * 7/2002 Chen et al. .............. 118/725

FOREIGN PATENT DOCUMENTS

JP          2604944      1/1997
JP          9-503349     3/1997
WO          WO95/30031   11/1995

* cited by examiner

Primary Examiner—Gregory Mills
Assistant Examiner—Ram N Kackar
(74) Attorney, Agent, or Firm—W. F. Fasse; W. G. Fasse

(57) ABSTRACT

A wafer holder is configured of a pair of ceramic base members and conductive layers each posed between the ceramic base members. The conductive layer has a body facing a wafer and an extension protruding from the body to the outside of a vacuum chamber for external electrical connection, wherein the body and the extension are arranged in a single plane. Thus there can be obtained a wafer holder for use with a semiconductor manufacturing apparatus that can reduce such distortion as caused when it is heated and cooled and that can also be readily manufactured.

42 Claims, 17 Drawing Sheets

WAFER HOLDER FOR SEMICONDUCTOR MANUFACTURING APPARATUS AND SEMICONDUCTOR MANUFACTURING APPARATUS USING THE SAME

BACKGROUND OF THE INVENTION

1. Field of the Invention

The present invention relates generally to wafer holders for semiconductor manufacturing apparatus and semiconductor manufacturing apparatus using the same and particularly to wafer holders for semiconductor manufacturing apparatus having a heater for heating a wafer, an electrode for an electrostatic chuck electrostatically holding a wafer or the functions of both of such heater and electrode, and semiconductor manufacturing apparatus using the same.

2. Description of the Background Art

In etching a surface of a semiconductor wafer or depositing a film thereon, a multitude of such wafers are held on a rack and batch-processed, exposed to an etchant gas or a gas for deposition, and circumferentially heated with a heater, as required. This technique is referred to as hot-wall technique.

In recent years, however, as semiconductor is required to be more highly integrated and operate more rapidly, semiconductor manufacturing apparatus have therein uneven temperature and gas flow varying with different portions thereof and such unevenness in temperature and gas flow disadvantageously varies the quality of a film etched or deposited. Accordingly, the batch process as described above is being replaced by arranging multiple etching apparatus and deposition apparatus and using a loader therebetween to automatically feed wafers to process a single wafer at one time. In doing so, the loader transfers a wafer to an etching apparatus or a deposition apparatus and places the wafer in a chamber therein on a holder holding the wafer by means of an electrostatic chuck or alternatively on a holder's wafer bearing side having a surface increased in precision so that the wafer can be placed still on and in close contact with the holder and the holder thus heats the wafer directly to heat the wafer uniformly. As such the holder needs to at least have a portion in contact with a wafer that is formed of a material resistant to a highly corrosive gas such as halogen gas and highly heat-conducting, and the holder per se also needs to function to electrostatically chuck, mechanically fix and heat a wafer.

A material having been noted as a material used for forming the holder is aluminum nitride, which is resistant to corrosion and highly heat-conducting. Powdery aluminum nitride is molded to provide media formed thereof and therebetween a coil or wire of a refractory metal such as Mo is interposed and they are then hot-pressed and thus sintered to embed a conductive layer used for a heater, an electrostatic chuck or the like. For example, Japanese Patent Publication No. 2604944 discloses a configuration with an embedded heater allowing a heat emitting side to provide more uniform heat. To provide a conductive layer, a molded medium formed of aluminum nitride and having a surface printed with a paste containing W, Mo or the like is placed on another medium and the aluminum nitride is sintered to provide a holder having a conductive layer embedded therein.

With a holder having such a structure as above, a heater or an electrostatic chuck is powered, as described with reference to FIG. 19. More specifically, as in a holder 110, a ceramic base member 104 has a back side provided with a pipe bonded thereto and accommodating therein extraction lines 107A and 107 B externally feeding power to each of conductive layers 101 and 102 serving as the heater or the electrostatic chuck.

The structure as shown in FIG. 19, however, is inevitably of three dimensions as holder 110 has a back side with pipe 106 bonded thereto. As such, the holder in the form of a disc and pipe 106 for accommodating the extraction lines must be manufactured separately and to bond holder 110 and pipe 106 together a bonding glass must be initially applied and diffusion-bonding or the like must be then employed, which is a cumbersome process.

Furthermore, holder 110 having a back side with a pipe bonded thereto would have front and back surfaces having different levels of heat dissipation. Thus the front side and the back side would have therebetween a difference in temperature and holder 110 would thus distort when it is heated or cooled. While a wafer is placed on holder 110 in close contact therewith so that the wafer is heated with an increased heat-transfer efficiency, holder 110 distorted would provide a gap between the holder and the wafer. This would result in uneven heat transfer which would then cause a variation in the temperature of the wafer's surface and hence an uneven etch rate and an uneven deposition rate in the wafer's plane. Accordingly, to prevent the holder from warpage the holder should be formed of a plate at least 5 mm thick, which would increase the cost for its source material(s).

Furthermore, bonding pipe 106 would increase the thermal capacity and if holder 110 is adapted to also function as a heater then it would require a long period of time to heat and cool the holder. Furthermore, in fabricating the pipe when the pipe molded has a binder heated and thus removed therefrom the binder is hard to remove and the pipe can thus break and the pipe tends to be unevenly sintered or deform when it is sintered so that the binder should be removed over a long period of time and furthermore the sintering charge level reduces, which significantly increases the production cost.

Furthermore this structure entails joining at an end of pipe 106. As such, the area for the joint should be considered to maintain the anti-leakage level as required and pipe 106 is thus required to have an increased diameter. Furthermore, if pipe 106 is also required to support holder 110, pipe 106 is also forced to have an increased diameter, resulting in the same disadvantage as described above.

It is possible to widen only the pipe 106 end in the form of a flange. This approach, however, requires applying extraction-molding to extract pipe 106 of a larger diameter and then remove the portion other than the flange.

Furthermore, the structure with pipe 106 joined would be damaged when it is transported, and it also has an in-furnace charge level inevitably reduced when the pipe is joined. Thus the production cost would be increased.

SUMMARY OF THE INVENTION

The present invention contemplates a wafer holder for use with a semiconductor manufacturing apparatus that can reduce such distortion as caused when it is heated and cooled and that can also be readily manufactured, and a semiconductor manufacturing apparatus employing the same.

The present invention in one aspect provides a wafer holder for use with a semiconductor manufacturing apparatus, including a conductive layer and a pair of ceramic base members sandwiching the conductive layer therebetween, wherein the conductive layer has a body located at a surface opposite a wafer holding surface of one of the ceramic base members and an extension protruding radially from the body to the outside of a vacuum chamber for external electrical connection, and the body and the extension are arranged substantially in a single plane. Throughout this specification, the extension is also referred to as an "extraction".

Since the present invention in one aspect provides a wafer holder for a semiconductor manufacturing apparatus including a conductive layer having a body and an extension or extraction provided in a single plane, the body and the extraction can be both posed and thus protected between paired ceramic base members each in the form of a flat plate. This can eliminate the necessity of using a pipe for protecting the extraction, as conventional, and hence the necessity of providing the step of bonding the pipe. As such, the wafer holder can be readily manufactured and also free of such distortion as attributed to bonding such pipe.

In the above one aspect the wafer holder preferably includes the ceramic base member formed of at least one material selected from the group consisting of aluminum nitride, silicon nitride, aluminum nitride oxide and aluminum oxide.

As such, a material resistant to corrosion and having a high heat conductance can be appropriately selected as the ceramic base member.

In the above one aspect the wafer holder preferably includes the ceramic base members having a heat conductance of no less than 100 W/mK.

As such, the wafer holder can be improved in heat uniformity to process a wafer more rapidly.

In the above one aspect the wafer holder preferably includes the conductive layer and the ceramic base member with an intermediate layer posed therebetween and formed of a material including at least one of glass having a thermal expansion coefficient of at least $3 \times 10^{-6}/°C$ and at most $8 \times 10^{-6}/°C$ and nonoxide ceramic having a thermal expansion coefficient of at least $3 \times 10^{-6}/°C$ and at most $6 \times 10^{-6}/°C$.

As such, there can be prevented such distortion as attributed to the difference between the thermal expansion coefficient of the intermediate layer and that of the ceramic base member. Furthermore, the thermal expansion coefficient ranged as above can satisfy the requirement that the wafer holder should be heated from a room temperature to 600° C. within 30 minutes. Furthermore, the intermediate layer containing nonoxide ceramic allows the wafer holder heated to a high temperature and receiving a high level of voltage to be satisfactorily resistant to heat, corrosion and voltage.

In the above one aspect the wafer holder preferably has the intermediate layer containing nonoxide ceramic containing at least 50% by mass of aluminum nitride or silicon nitride.

The nonoxide ceramic corresponding to aluminum nitride or silicon nitride allows the wafer holder heated to a high temperature and receiving a high level of voltage to be further satisfactorily resistant to heat, corrosion and voltage.

In the above one aspect the wafer holder preferably has the intermediate layer formed of a material including an oxide containing ytterbium, neodymium and calcium or a compound producing an oxide containing ytterbium, neodymium and calcium when heat treatment is performed.

As such, if the base member is formed of aluminum nitride the intermediate layer can have a satisfactory wettability and bond performance.

In the above one aspect the wafer holder preferably has the intermediate layer formed of a material containing an oxide containing yttrium and aluminum or a compound producing an oxide containing yttrium and aluminum when heat treatment is performed.

As such, if the base member is formed of silicon nitride the intermediate layer can have a satisfactory wettability and bond performance.

In the above one aspect the wafer holder preferably includes the ceramic base member having a hole formed therein for arranging a temperature detection unit therein.

Thus the temperature of a surface of a wafer to be processed can be detected by the temperature detection unit. The hole, elongate to introduce the temperature detection unit from the side plate portion into the body to reach a predetermined position, can be readily formed by providing one or both of the substrates with a groove and then bonding them together.

In the above one aspect the wafer holder preferably includes the pair rap of ceramic base members having their respective wafer holding portions sandwiching the body and their respective side plate portions each extending from a side surface of the wafer holding portion and together sandwiching the extraction, and having a width smaller than a width of the wafer holding portion.

As such the heat of the wafer holding portion can be prevented from dissipating to the side plate portion. As such, the wafer holding portion can be rapidly heated to process a wafer more rapidly.

In the above one aspect the wafer holder preferably includes the conductive layer at least having the body formed of a material formed of at least one element selected from the group consisting of W, Mo, Ag, Pd, Pt, Ni and Cr.

Thus the conductive layer can be formed of a material appropriately selected suitable for the production.

In the above one aspect the wafer holder preferably includes the conductive layer corresponding to any one of a heater, an electrode for generating a plasma and an electrode for an electrostatic chuck.

As such, in either one of the heater, the electrode for generating a plasma and the electrode for an electrostatic chuck no pipe is required in protecting an extraction.

In the above one aspect the wafer holder preferably has a total thickness of no more than 5 mm.

As such the wafer holder can heat and cool and thus process a wafer rapidly.

In the above one aspect the wafer holder preferably includes the conductive layer formed of a wire.

As such the present invention can also be applied to a wafer holder including a conductive layer formed of a wire.

In the above one aspect the wafer holder is preferably provided with an O-ring arranged on and extending around the side plate portions of the pair of ceramic base members sandwiching the extraction.

As such, in the semiconductor manufacturing apparatus with the holder attached therein the vacuum chamber can maintain its internal vacuum.

In the above one aspect the wafer holder is preferably provided with a heat insulating neck provided in at least one of the side plate portions of the pair of ceramic base members sandwiching the extraction.

As such, the side plate portion can effectively insulate heat to prevent heat from dissipating from the wafer holding portion to the side plate portion. As such, the wafer holding portion can be improved in heat uniformity, the O ring attached to the side plate portion can be free of thermal degradation, and the side plate portion can be reduced in length.

In the above one aspect the wafer holder is preferably provided with the heater having its body in a region sandwiched between the side plate portions of the pair of ceramic base members.

As such, the side plate portion, readily allowing heat to dissipate, can also emit heat to prevent the side plate portion and therearound from being cooled.

The present invention in one aspect provides a semiconductor manufacturing apparatus having incorporated therein the above wafer holder for use with a semiconductor manufacturing apparatus.

As such, there can be provided a semiconductor manufacturing apparatus having a wafer holder for use with a semiconductor manufacturing apparatus that can be prevented from distorting when it is heated and cooled and that can also be readily manufactured.

In the above one aspect the semiconductor manufacturing apparatus is preferably either one of an etching apparatus, a chemical vapor deposition apparatus and a plasma chemical vapor deposition apparatus.

As such, there can be provided an etching apparatus, a CVD apparatus and a plasma CVD apparatus having a wafer holder for use with a semiconductor manufacturing apparatus that can be prevented from distorting when it is heated and cooled and that can also be readily manufactured.

The present invention in another aspect provides a wafer holder for a semiconductor manufacturing apparatus, including a ceramic base member, a conductive layer provided on the ceramic base member and a protection layer covering the conductive layer, wherein the conductive layer has a body facing a wafer holding surface of the ceramic base member and an extraction extracted from the body for external connection and the body and the extraction are arranged substantially in a single plane.

Since the present invention in one aspect provides a wafer holder for use with a semiconductor manufacturing apparatus including a conductive layer having a body and an extraction provided in a single plane, covering with the protection layer can protect the conductive layer. This can eliminate the necessity of using a pipe for protecting the extraction, as conventional, and hence the necessity of providing the step of bonding the pipe. As such, the wafer holder can be readily manufactured and also free of such distortion as attributed to bonding such pipe.

In the above one aspect the wafer holder preferably includes the ceramic base member formed of at least one material selected from the group consisting of aluminum nitride, silicon nitride, aluminum nitride oxide and aluminum oxide.

As such, a material resistant to corrosion and having a high heat conductance can be appropriately selected as the ceramic base member.

In the above one aspect the wafer holder preferably includes the ceramic base member having a heat conductance of no less than 100 W/mK.

As such, the wafer holder can be improved in heat uniformity to process a wafer more rapidly.

In the above one aspect the wafer holder preferably includes the protection layer formed of a material including at least one of glass having a thermal expansion coefficient of at least $3\times10^{-6}/°C$. and at most $8\times10^{-6}/°C$. and nonoxide ceramic having a thermal expansion coefficient of at least $3\times10^{-6}/°C$. and at most $6\times10^{-6}/°C$.

As such, there can be prevented such distortion as attributed to the difference between the thermal expansion coefficient of the protection layer and that of the ceramic base member. Furthermore, the thermal expansion coefficient ranged as above can satisfy the requirement that the wafer holder should be heated from a room temperature to 600° C. within 30 minutes. Furthermore, the protection layer containing nonoxide ceramic allows the wafer holder having a high temperature and receiving a high level of voltage to be satisfactorily resistant to heat, corrosion and voltage.

In the above one aspect the wafer holder preferably has the protection layer containing nonoxide ceramic containing at least 50% by mass of aluminum nitride or silicon nitride.

The nonoxide ceramic corresponding to aluminum nitride or silicon nitride allows the wafer holder having a high temperature and receiving a high level of voltage to be further satisfactorily resistant to heat, corrosion and voltage.

In the above one aspect the wafer holder preferably has the protection layer formed of a material including an oxide containing ytterbium, neodymium and calcium or a compound producing an oxide containing ytterbium, neodymium and calcium when heat treatment is performed.

As such, if the base member is formed of aluminum nitride the protection layer can have a satisfactory wettability and bond performance.

In the above one aspect the wafer holder preferably has the protection layer formed of a material containing an oxide containing yttrium and aluminum or a compound producing an oxide containing yttrium and aluminum when heat treatment is performed.

As such, if the base member is formed of silicon nitride the intermediate layer can have a satisfactory wettability and bond performance.

In the above one aspect the wafer holder preferably includes the ceramic base member having a hole formed therein for arranging a temperature detection unit therein.

Thus the temperature of a surface of a wafer to be processed can be detected by the temperature detection unit. The hole, elongate to introduce the temperature detection unit from the side plate portion into the body to reach a predetermined position, can be readily formed by providing one or both of the substrates with a groove and then bonding them together.

In the above one aspect the wafer holder preferably includes the conductive layer at least having the body formed of a material formed of at least one element selected from the group consisting of W, Mo, Ag, Pd, Pt, Ni and Cr.

Thus the conductive layer can be formed of a material appropriately selected suitable for the production.

In the above one aspect the wafer holder preferably includes the conductive layer corresponding to any one of a heater, an electrode for generating a plasma and an electrode for an electrostatic chuck.

As such, in either one of the heater, the electrode for generating a plasma and the electrode for an electrostatic chuck no pipe is required in protecting an extraction.

In the above one aspect the wafer holder preferably has a total thickness of no more than 5 mm.

As such the wafer holder can heat and cool and thus process a wafer rapidly.

In the above one aspect the wafer holder preferably includes the conductive layer formed of a wire.

As such the present invention can also be applied to a wafer holder including a conductive layer formed of a wire.

In the above one aspect the wafer holder preferably includes the ceramic base member and the protection layer having their respective wafer holding portions sandwiching the body and their respective side plate portions each extending from a side surface of the wafer holding portion, together sandwiching the extraction and having a width smaller than a width of the wafer holding portion.

As such the heat of the wafer holding portion can be prevented from dissipating to the side plate portion. As such, the wafer holding portion can be rapidly heated to process a wafer more rapidly.

In the above one aspect the wafer holder is preferably provided with an O ring arranged on the side plate portion of the ceramic base member and the side plate portion of the protection layer together sandwiching the extraction.

As such, in the semiconductor manufacturing apparatus with the holder attached therein the vacuum chamber can maintain its internal vacuum.

In the above one aspect the wafer holder is preferably provided with a heat insulating neck provided in at least one of the side plate portion of the ceramic base member and the side plate portion of the protection layer together sandwiching the extraction.

As such, the side plate portion can effectively insulate heat to prevent heat from dissipating from the wafer holding portion to the side plate portion. As such, the wafer holding portion can be improved in heat uniformity, the O ring attached to the side plate portion can be free of thermal degradation, and the side plate portion can be reduced in length.

In the above one aspect the wafer holder is preferably provided with the heater having its body in a region sandwiched between the side plate portion of the ceramic base member and the side plate portion of the protection layer.

As such, the side plate portion, readily allowing heat to dissipate, can also emit heat to prevent the side plate portion and therearound from being cooled.

The present invention in one aspect provides a semiconductor manufacturing apparatus having incorporated therein the above wafer holder for use with a semiconductor manufacturing apparatus.

As such, there can be provided a semiconductor manufacturing apparatus having a wafer holder for use with a semiconductor manufacturing apparatus that can be prevented from distorting when it is heated and cooled and that can also be readily manufactured.

In the above one aspect the semiconductor manufacturing apparatus is preferably either one of an etching apparatus, a chemical vapor deposition apparatus and a plasma chemical vapor deposition apparatus.

As such, there can be provided an etching apparatus, a CVD apparatus and a plasma CVD apparatus having a wafer holder for use with a semiconductor manufacturing apparatus that can be prevented from distorting when it is heated and cooled and that can also be readily manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the embodiments of the present invention will now be described with reference to the drawings.

Figure 1:
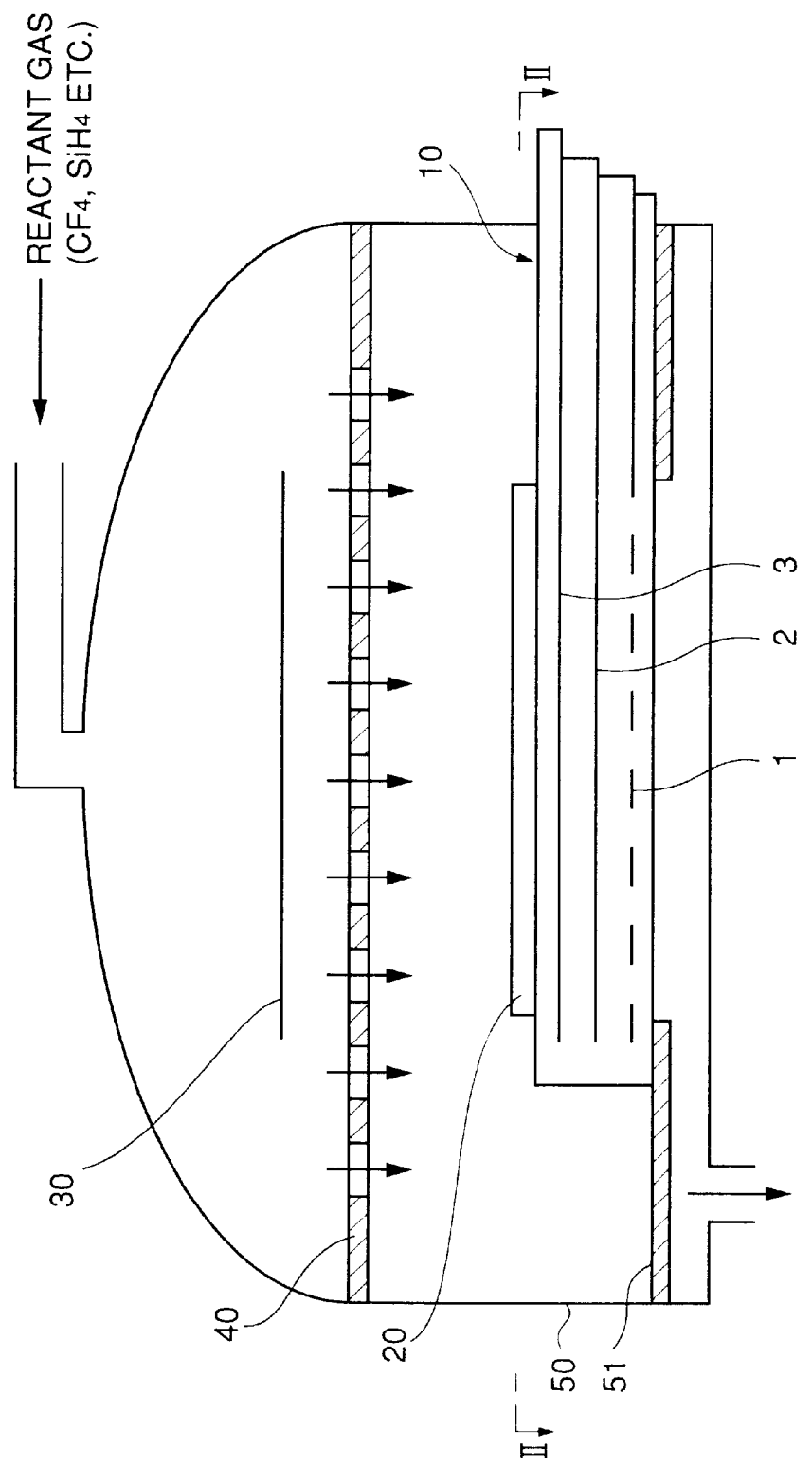
FIG. 1 is a cross section schematically showing a configuration of a semiconductor manufacturing apparatus with a wafer holder in one embodiment of the present invention.
Figure 2:
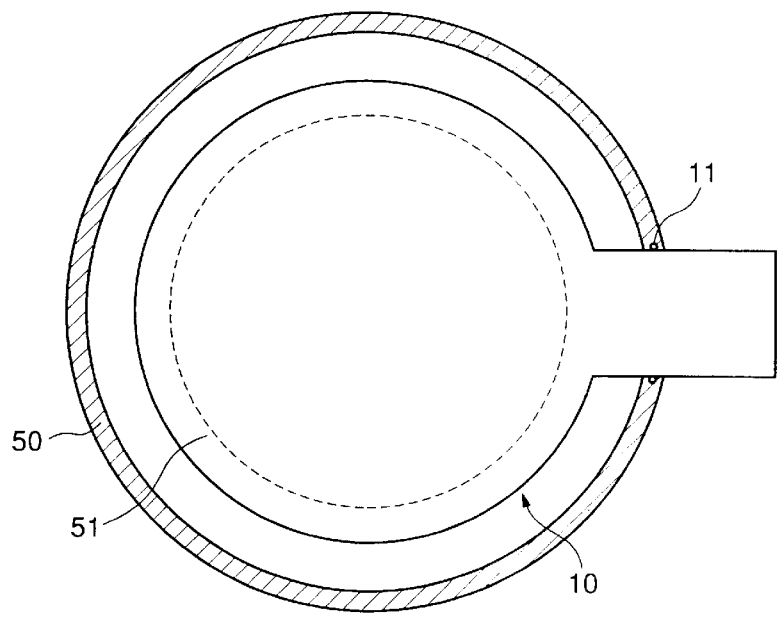
FIG. 2 is a schematic cross section taken along the line II—II of FIG. 1.

As shown in FIGS. 1 and 2, a semiconductor manufacturing apparatus is mainly formed for example of a vacuum chamber 50 having provided therein a wafer holder 10, a top electrode 30 for generating a plasma, and a gas shower unit 40. Wafer holder 10 is used to hold a wafer 20 and mainly has a heater 1 for heating wafer 20, a bottom electrode 2 for generating a plasma, and an electrode 3 for an electrostatic chuck for holding wafer 20.

Wafer holder 10 sits and is thus held on a support 51 provided in the form e.g. of a doughnut provided on an inner wall surface of vacuum chamber 50 circumferentially.

It should be noted that preferably the semiconductor manufacturing apparatus is an etching apparatus, chemical vapor deposition (CVD) apparatus or a plasma CVD apparatus.

Figure 3:
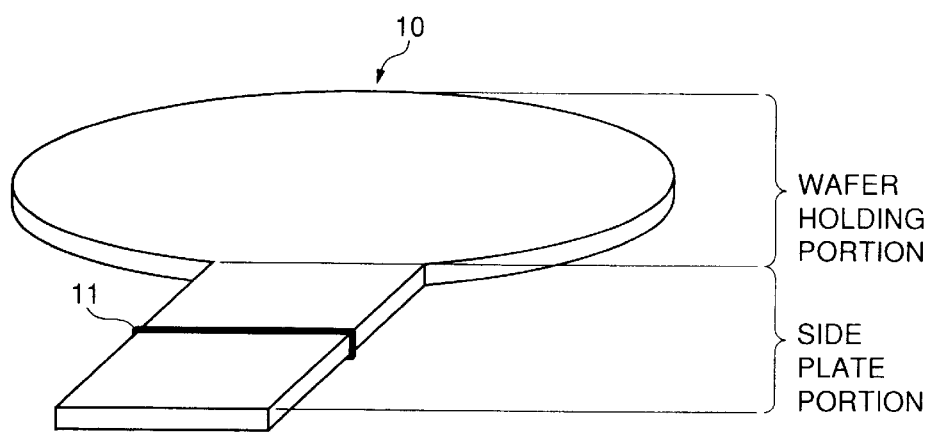
FIG. 3 is a perspective view schematically showing a configuration of a wafer holder in one embodiment of the present invention.

Wafer holder 10, as shown in the FIG. 3 perspective view, has a generally round wafer holding portion and a side plate portion extending from a side surface of the wafer holding portion. The side plate portion has an end protruding outwardly of vacuum chamber 50, as shown in FIGS. 1 and 2, for external, electrical connection. To maintain the vacuum in vacuum chamber 50, an O-ring 11 is arranged around the side plate portion to be between the side plate portion and vacuum chamber 50.

Wafer holder 10 is specifically configured as described hereinafter.

Figure 4:
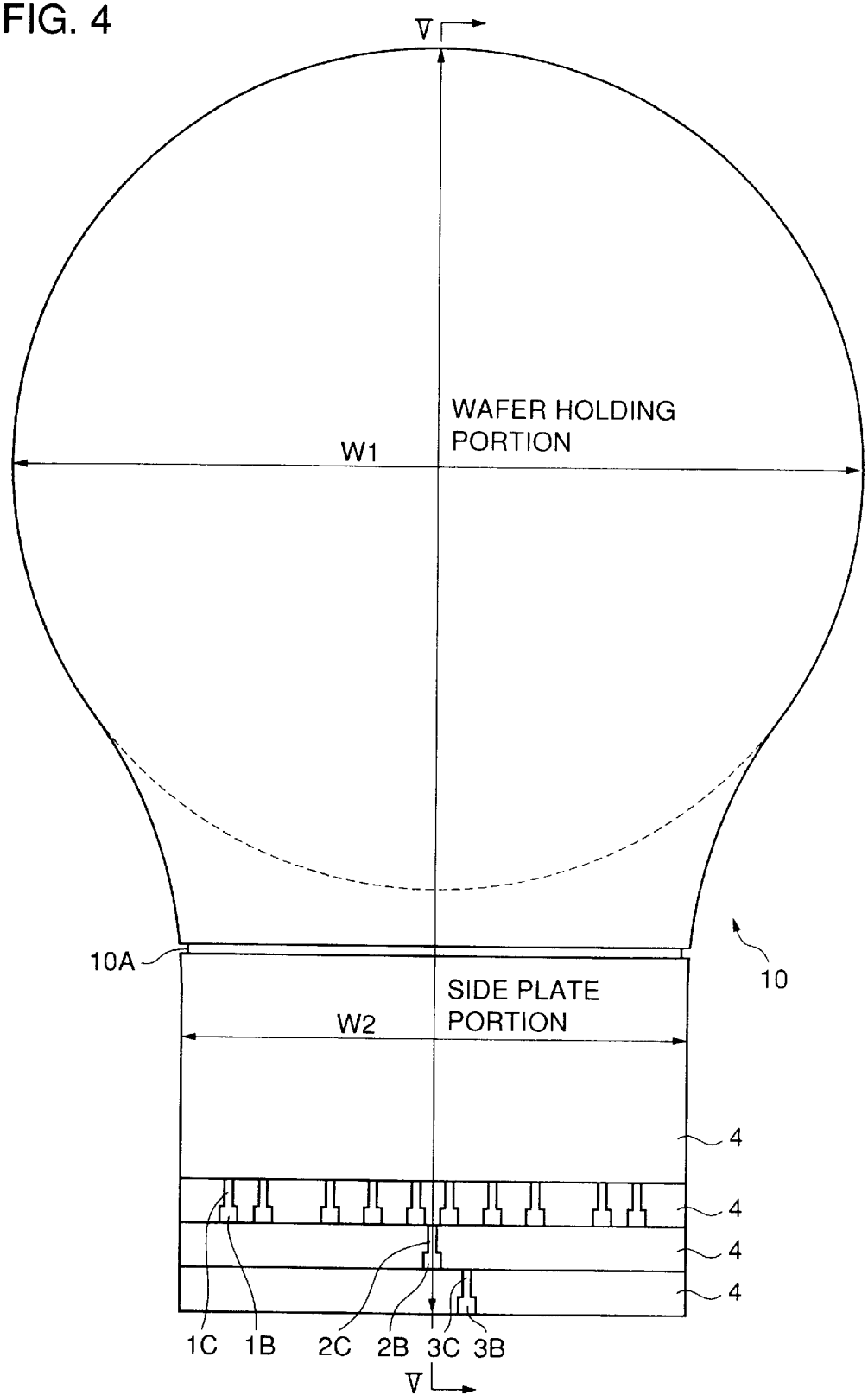
FIG. 4 is a plan view schematically showing a configuration of a wafer holder in one embodiment of the present invention.
Figure 5:
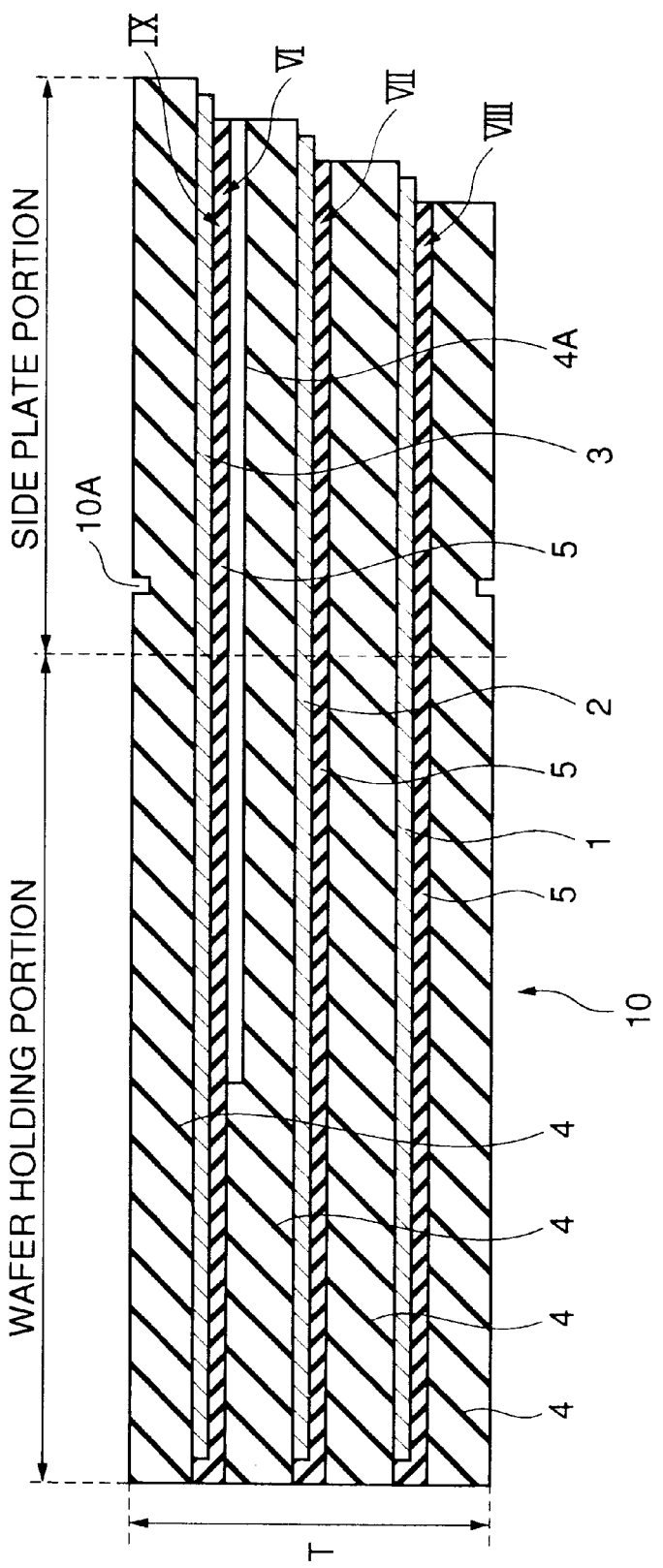
FIG. 5 is a schematic cross section taken along the line V—V of FIG. 4.

As shown in FIGS. 4 and 5, wafer holder 10 is configured of a heater 1, a bottom electrode 2 for generating a plasma and an electrode 3 for an electrostatic chuck that are each sandwiched by a ceramic base member 4 and thus stacked. Each ceramic base member 4 is bonded with a bonding layer 5 formed for example of an oxide layer such as a glass layer.

Furthermore the side plate portion has a stepwise end to allow heater 1, the bottom electrode 2 for generating a plasma and the electrode 3 for an electrostatic chuck to have exposed pad portions 1B, 2B, 3B. The exposed pad portions 1B, 2B, 3B allow heater 1 and electrodes 2 and 3 to be externally, electrically connected.

Furthermore, the ceramic base member 4 is also provided with a gap 4A corresponding to a hole into which a thermocouple is externally inserted to measure the temperature of a surface of a wafer.

Figure 6:
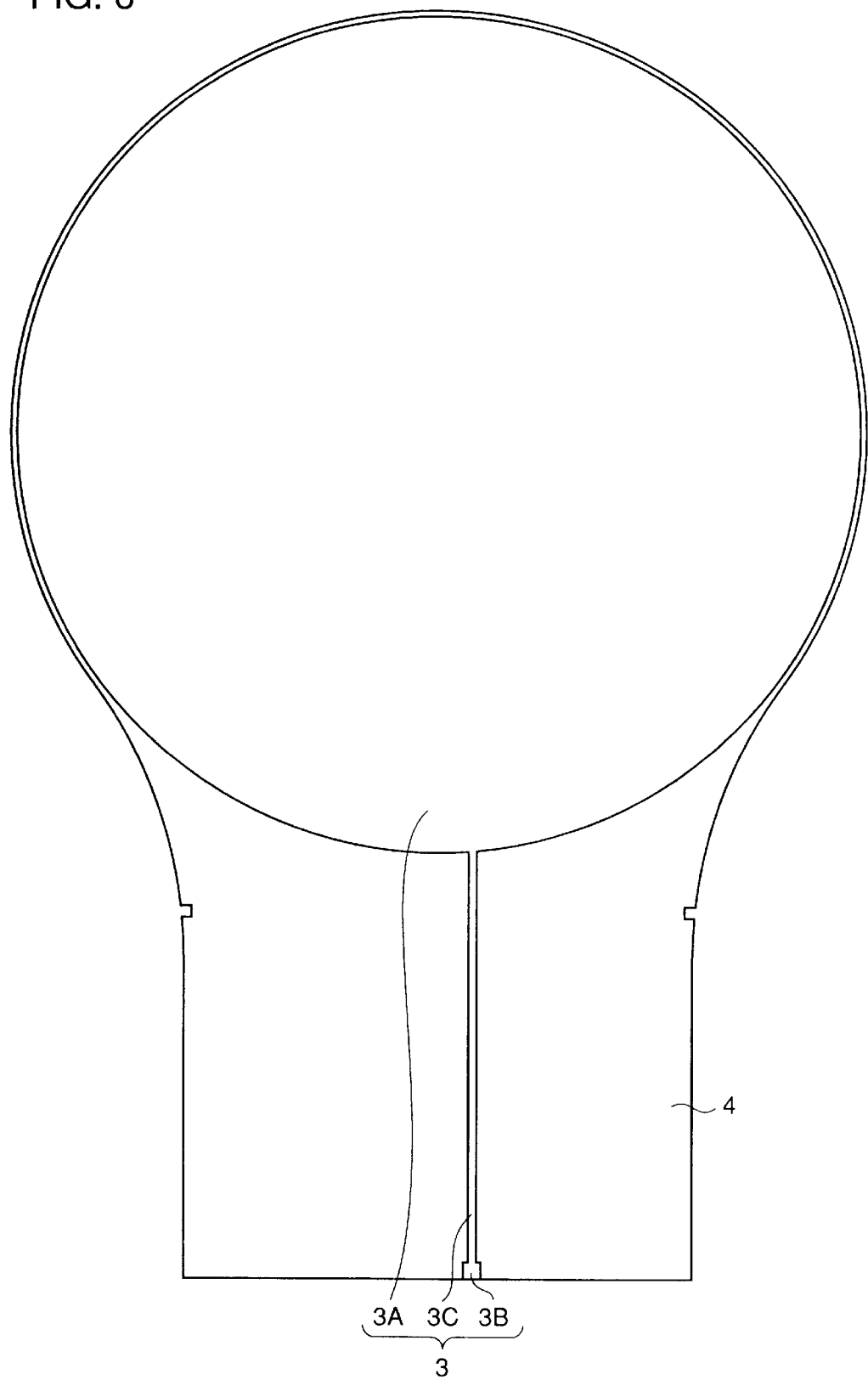
FIG. 6 is a plan view of an electrode for an electrostatic chuck as seen in the direction of the arrow VI of FIG. 5.

As shown in FIG. 6, the electrode 3 for an electrostatic chuck has a body 3A formed across the substantially entire surface of the wafer holding portion, pad portion 3B, and an extraction 3C provided to connect body 3A and pad portion 3B together. Body 3A, pad 3B and extraction 3C are provided substantially in a single plane.

Figure 7:
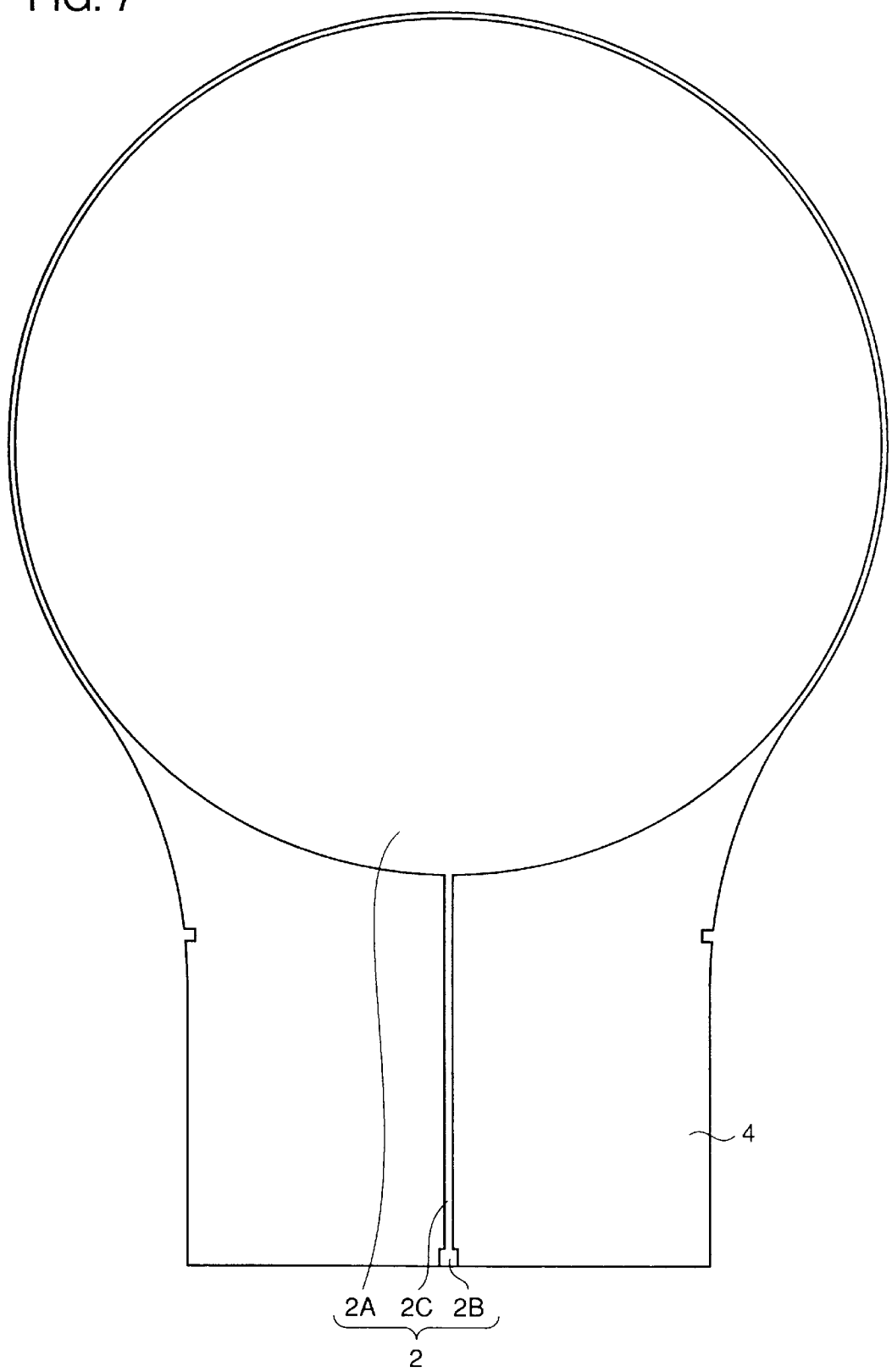
FIG. 7 is a plan view of the bottom electrode for generating a plasma, as seen in the direction of the arrow VII of FIG. 5.

As shown in FIG. 7, the bottom electrode 2 for generating a plasma has a body 2A formed substantially over the entirety of the wafer holding portion, pad 2B, and an extraction 2C provided to connect body 2A and pad 2B together. Body 2A, pad 2B and extraction 2C are provided substantially in a single plane.

Figure 8:
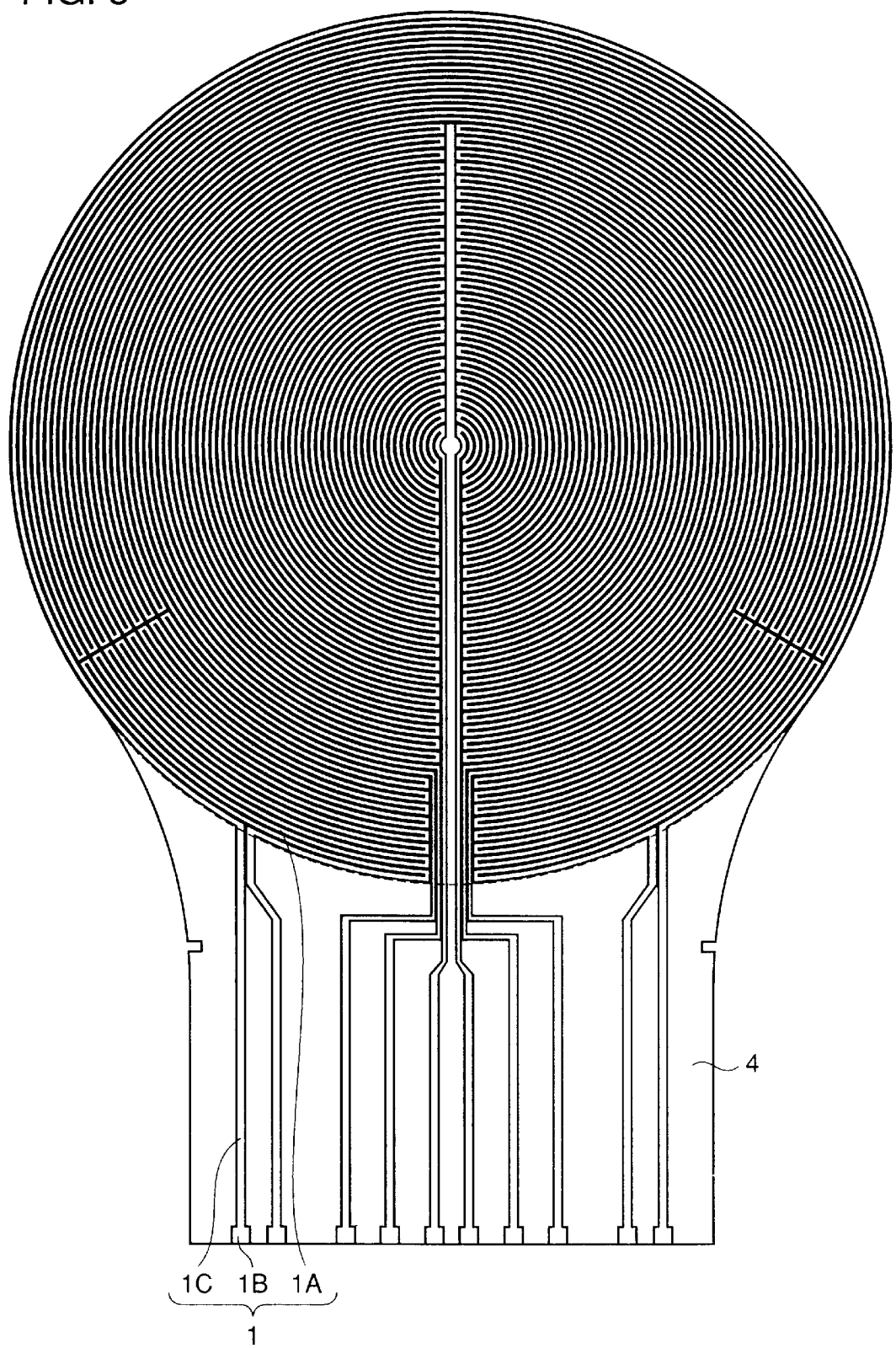
FIG. 8 is a schematic plan view of a heater as seen in the direction of the arrow VIII of FIG. 5.

As shown in FIG. 8, heater 1 has a body 1A having a plurality of arcuate patterns on the wafer holding portion, pad 1B, and an extraction 1C provided to connect body 1A and pad 1B together. Body 1A, pad 1B and extraction 1C are provided substantially in a single plane. To uniformly heat a wafer on body 1A, heater 1 for example has five zones electrically divided. Each zone requires two pads 1B and heater 1 thus has a total of ten pads 1B, although heater 1 is not limited to a 5-zone heater.

Figure 9:
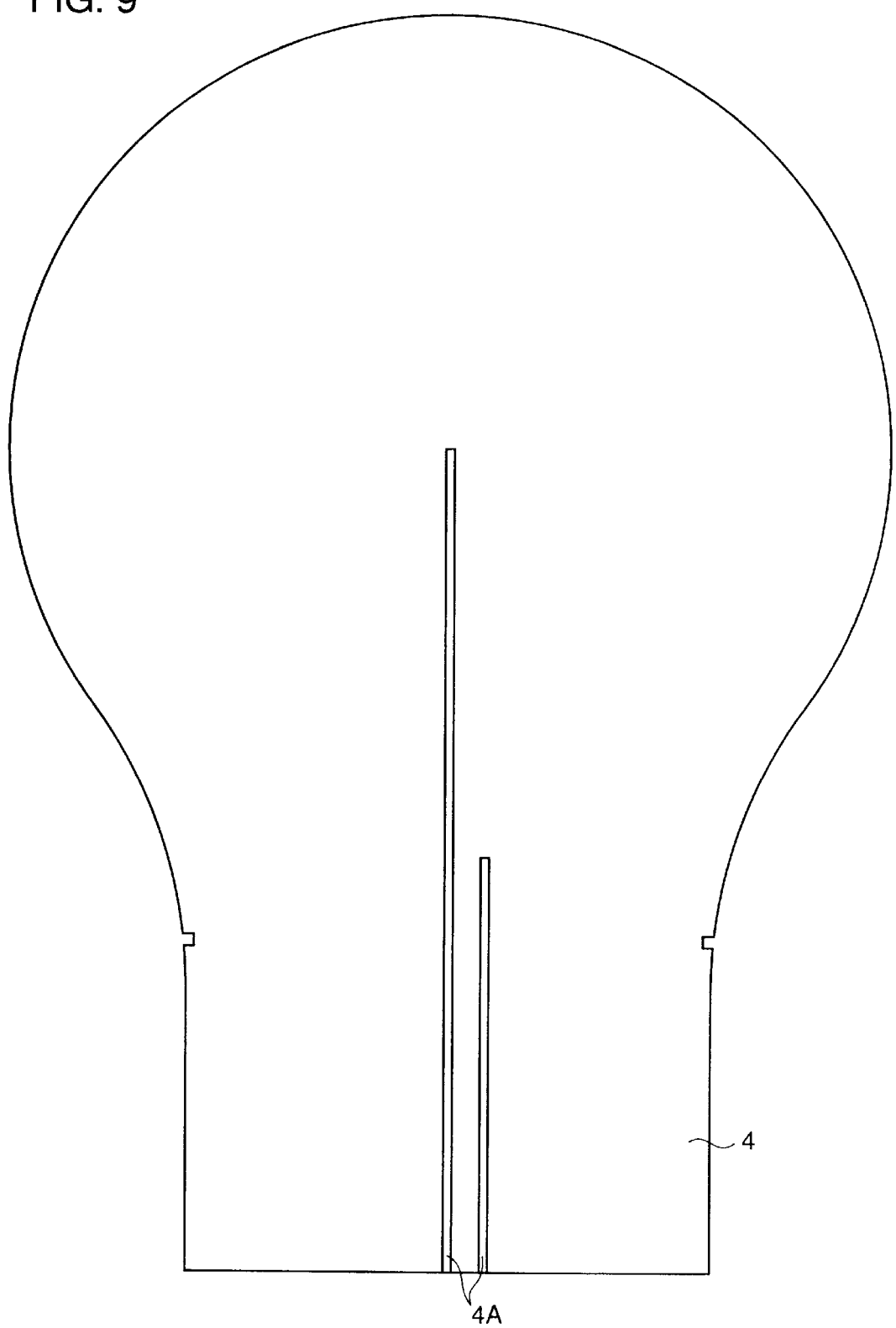
FIG. 9 is a plan view of a gap for insertion of a thermocouple as seen in the direction of the arrow IX of FIG. 5.

As shown in FIG. 9, there are for example provided two gaps 4A for insertion of a thermocouple to detect the temperature of a center of a wafer and that of a periphery of the wafer.

The ceramic base member 4 is formed of a material resistant to heat and resistant to the corrosion attributed to a gaseous plasma containing halogen and it is preferably formed of at least one selected from the group consisting of aluminum nitride, silicon nitride, aluminum nitride oxide and aluminum oxide, more preferably aluminum nitride. Furthermore, the ceramic base member 4 preferably has a heat conductance of at least 100 W/mK.

Furthermore, glass layer 5 serving as the bonding layer is preferably formed of a material containing at least one of glass having a thermal expansion coefficient of at least $3 \times 10^{-6}$/°C. and at most $8 \times 10^{-6}$/°C. and nonoxide ceramic having a thermal expansion coefficient of at least $3 \times 10^{-6}$/°C. and at most $6 \times 10^{-6}$/°C.

Furthermore the nonoxide ceramic preferably contains at least 50% by mass of aluminum nitride or silicon nitride.

If ceramic base member 4 is formed of aluminum nitride, bonding layer 5 is preferably formed of a material containing an oxide containing ytterbium, neodymium and calcium, or a compound producing an oxide containing ytterbium, neodymium and calcium when the compound is heated. If ceramic base member 4 is formed of silicon nitride, bonding layer 5 is preferably formed of a material containing an oxide containing yttrium and aluminum, or a compound producing an oxide containing yttrium and aluminum when the compound is heated.

Furthermore, as shown in FIG. 4, a width W2 of the side plate portion, extending in a direction orthogonal to the direction in which the side plate portion is extracted, is preferably smaller than a width W1 of the wafer holding portion.

Furthermore, of heater 1, the bottom electrode 2 for generating a plasma and the electrode 3 for an electrostatic chuck, at least bodies 1A, 2A, 3A are preferably formed of at least one selected from the group consisting of W, Mo, Ag, Pd, Pt, Ni and Cr.

Furthermore, as shown in FIG. 5, wafer holder 10 preferably has a total thickness T of no more than 5 mm.

Furthermore, heater 1, the bottom electrode 2 for generating a plasma and the electrode 3 for an electrostatic chuck may each be a wire. Furthermore, the side plate portion is preferably provided with a neck 10A corresponding for example to a groove, although neck 10A is not limited to a groove and it may be formed by reducing the side plate portion in width.

Figure 10:
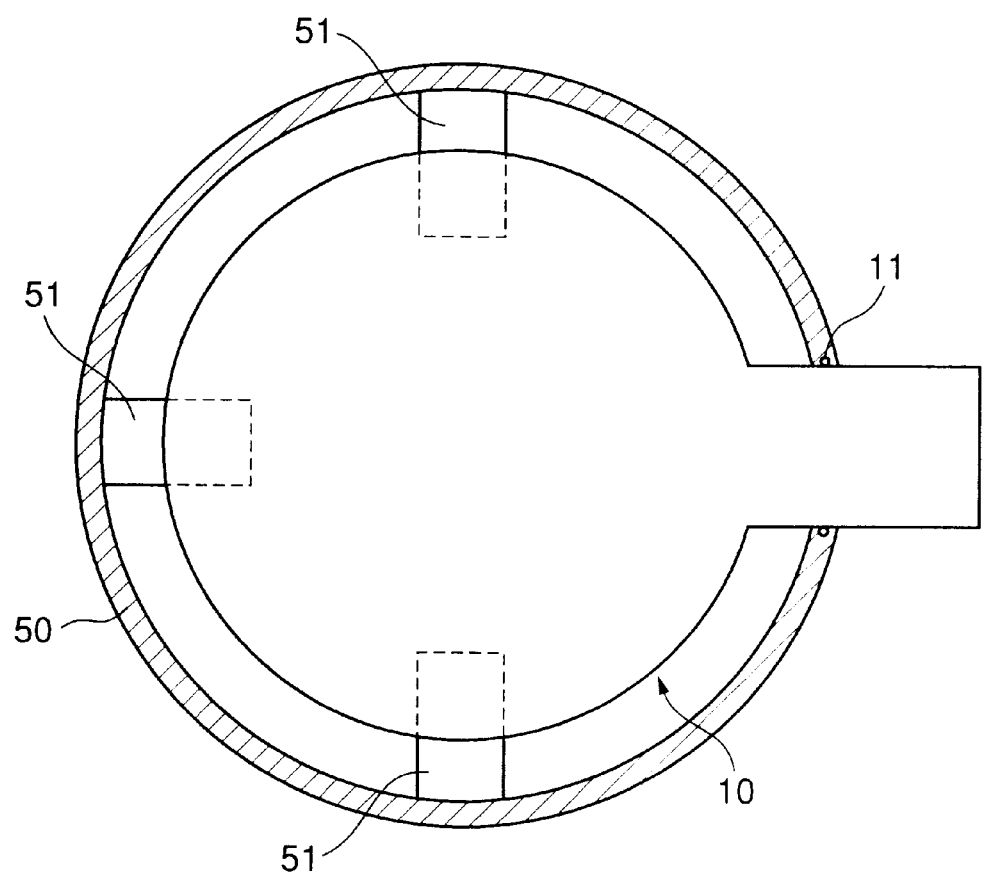
FIG. 10 is a cross section for illustrating another method of supporting a wafer holder.

Furthermore, support 51 does not need to protrude in vacuum chamber 50 at the internal wall circumferentially and it may protrude partially, as shown in FIG. 10.

Figure 11:
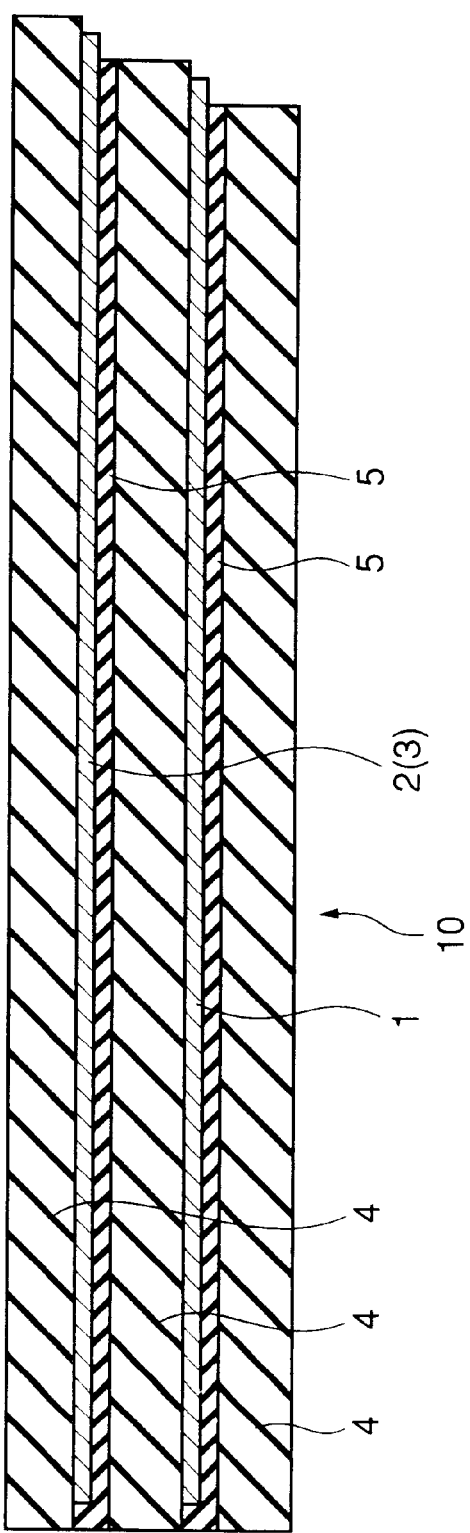
FIG. 11 is a schematic cross section showing a configuration of a wafer holder of a double-layered conductive layer.
Figure 12:
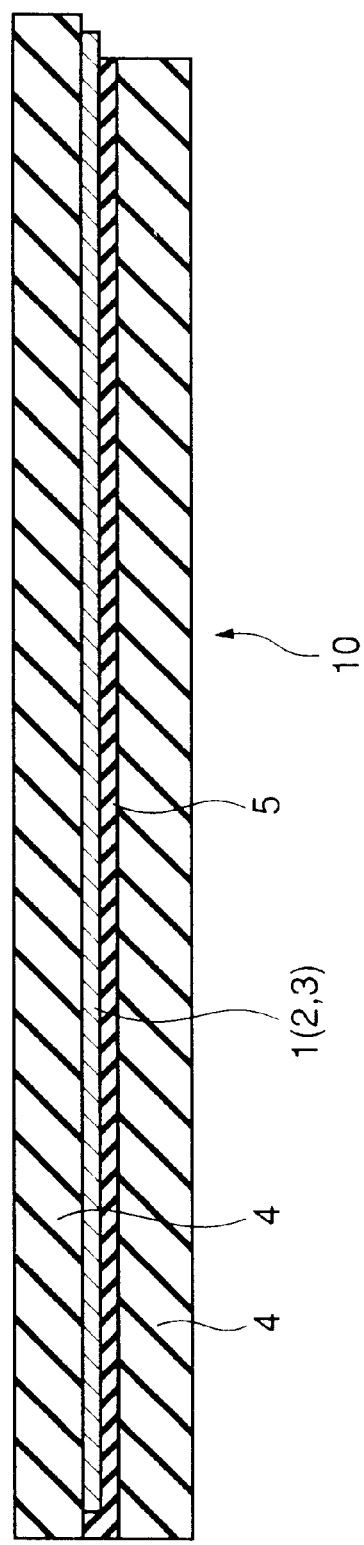
FIG. 12 is a schematic cross section showing a configuration of a wafer holder with a mono-layered conductive layer.

While in the above description heater 1, the bottom electrode 2 for generating a plasma and the electrode 3 for an electrostatic chuck are all provided, the conductive layer may have a double-layered structure formed of heater 1 and electrode 2 or 3, as shown in FIG. 11. In this structure, one conductive layer may serve as both electrodes 2 and 3.

Furthermore, the conductive layer may have a monolayered structure formed any one of heater 1, the bottom electrode 2 for generating a plasma and the electrode 3 for an electrostatic chuck.

Figure 13:
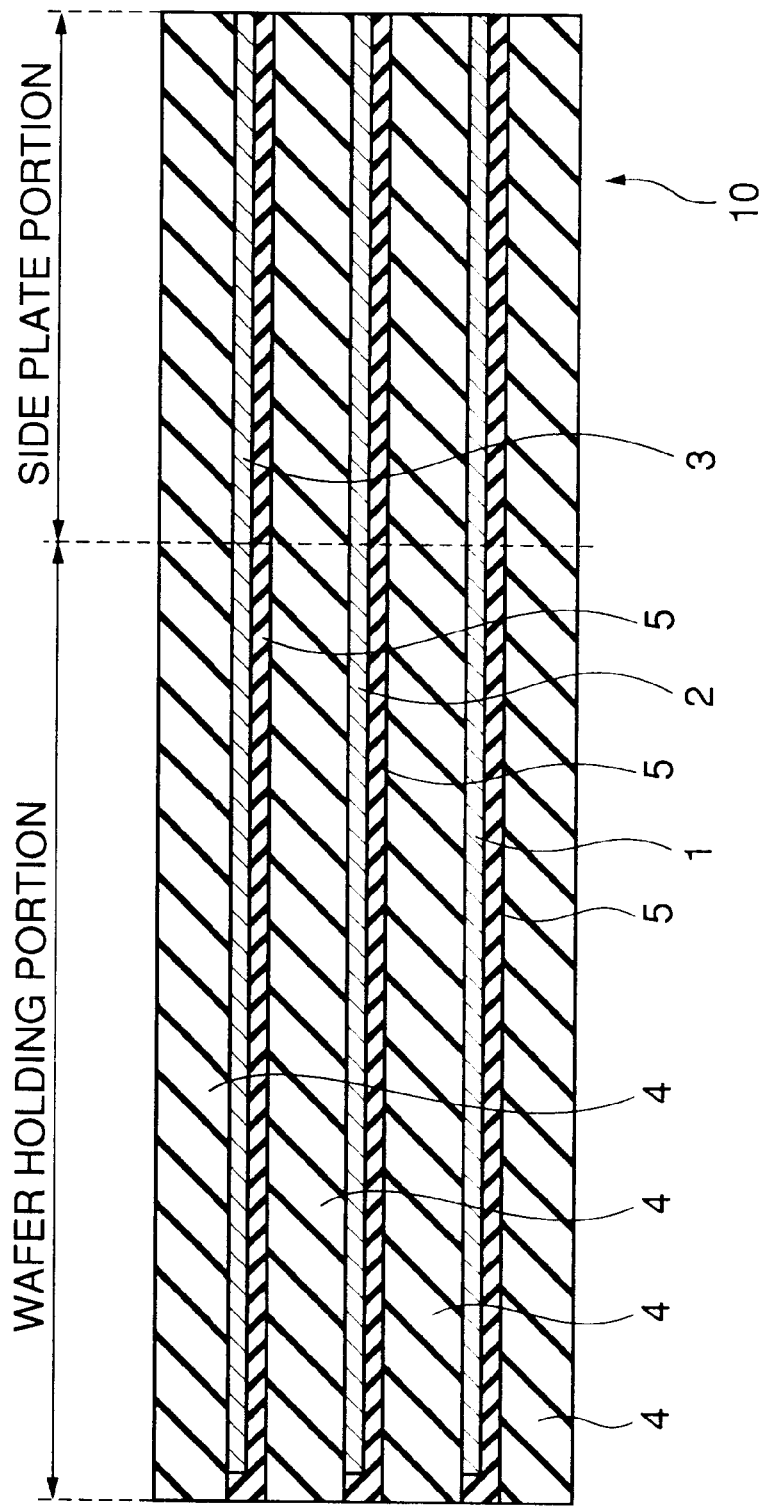
FIG. 13 is a schematic cross section for illustrating a flush end surface of a side plate portion.

Furthermore, while the side plate portion may have an end formed stepwise, as shown in FIG. 5, alternatively it may be flush, as shown in FIG. 13. In this structure the side plate portion has an end surface with heater 1, the bottom electrode 2 for generating a plasma and the electrode 3 for an electrostatic chuck each exposed.

Figure 14:
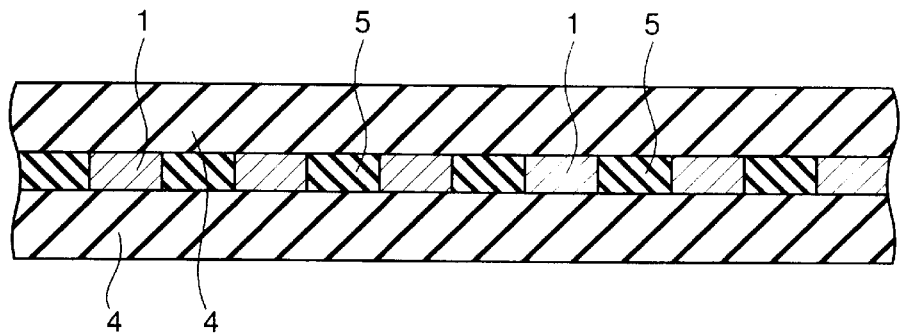
FIG. 14 is a schematic cross section showing a configuration with a glass layer provided only between patterns.

Furthermore, while in FIG. 5 bonding layer 5 is interposed between each of heater 1, the bottom electrode 2 for generating a plasma and the electrode 3 for an electrostatic chuck, and ceramic base member 4, bonding layer 5 may alternatively be provided only between patterns of a conductive layer such as heater 1, as shown in FIG. 14.

Figure 15:
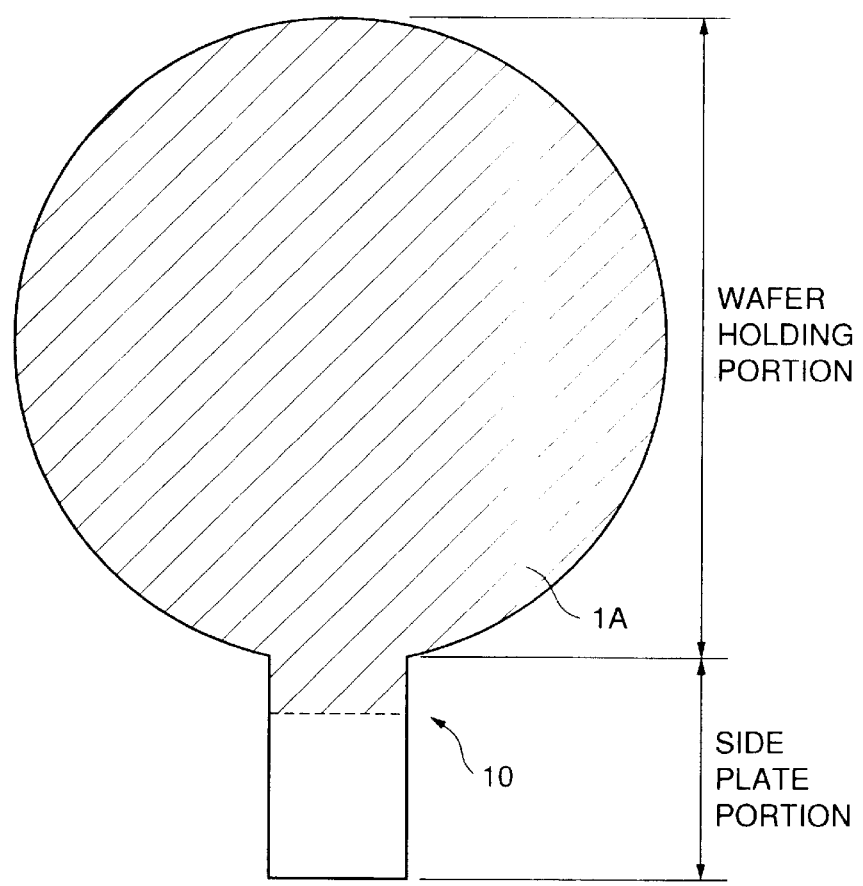
FIG. 15 is a plan view showing a configuration with a heater's heat emitting portion formed extending as far as a side plate portion.

Furthermore, as shown in FIG. 15, heater 1 may have a heat emitting region corresponding to its body (the hatched region in the figure) 1A that is provided not only in the wafer holding portion but also the side plate portion.

Figure 16:
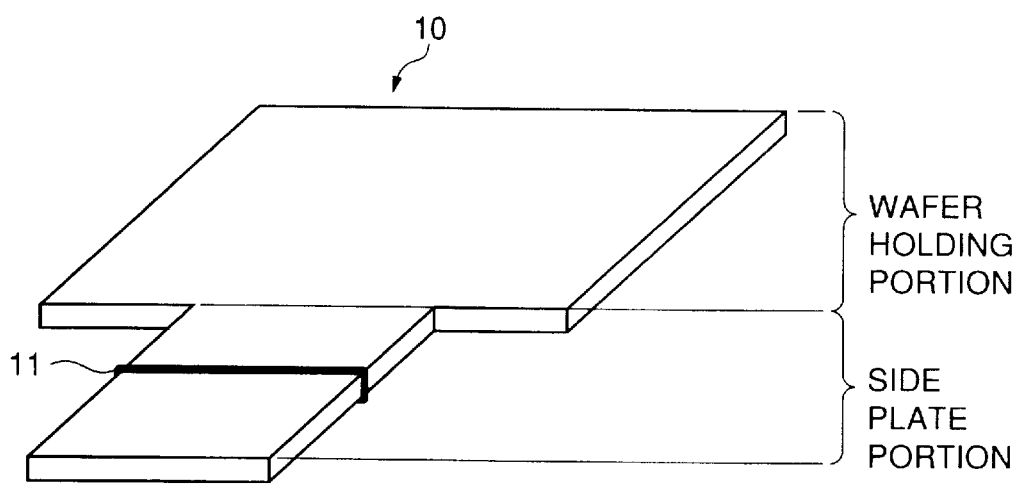
FIG. 16 is a perspective view for illustrating a wafer holder in the form of a polygon.

Furthermore, the wafer holding portion is not limited to a round shape as seen in its plan view and it may be in the form of a polygon (for example a quadrangle), as shown in FIG. 16.

Figure 17:
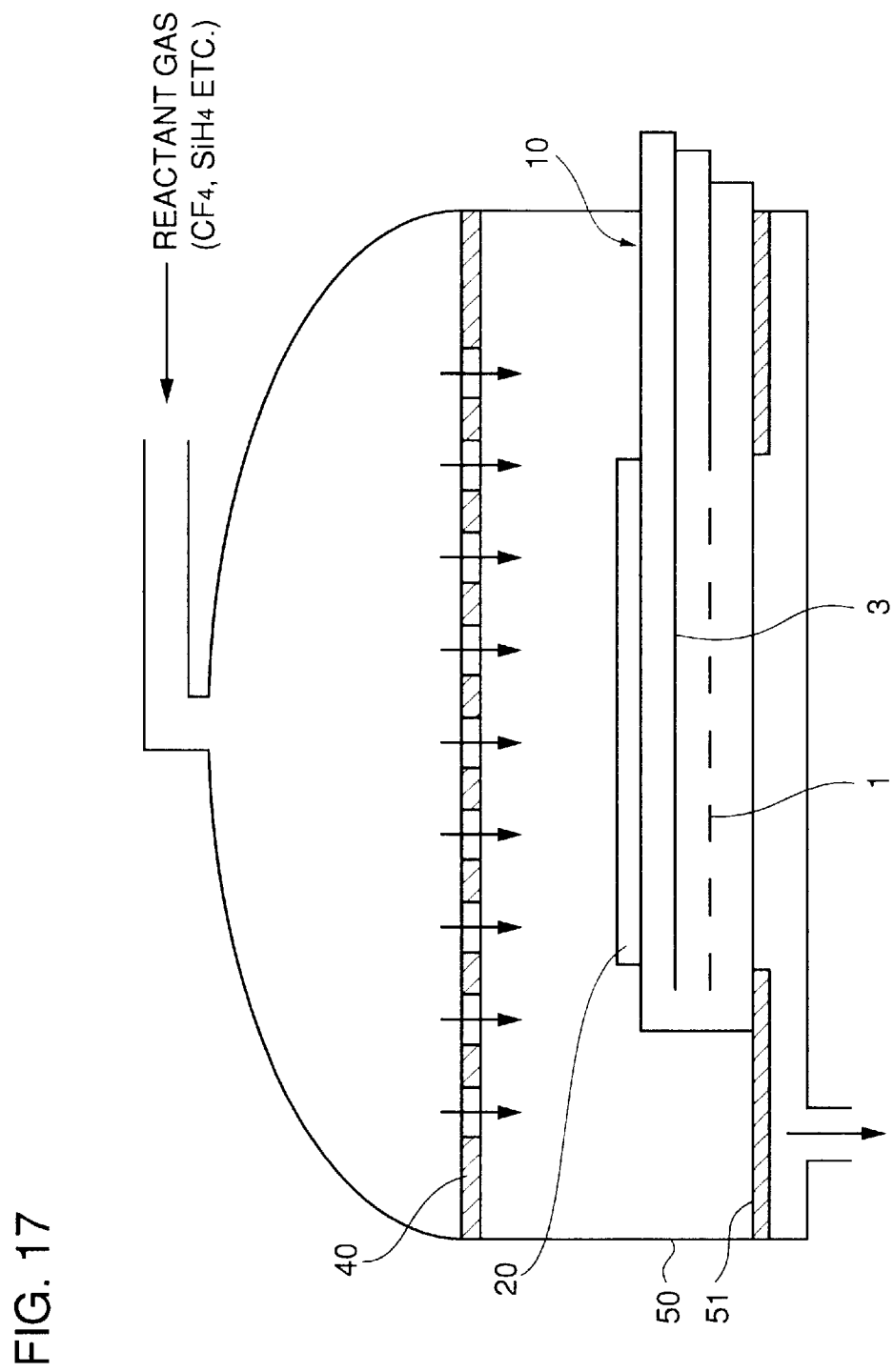
FIG. 17 is a schematic cross section of another exemplary semiconductor manufacturing apparatus with a wafer holder in one embodiment of the present invention.

While in FIG. 1 the semiconductor manufacturing apparatus has an electrode for generating a plasma, wafer holder 10 of the present embodiment may also be applied to a semiconductor manufacturing apparatus which does not have an electrode for generating a plasma, as shown in FIG. 17. In this configuration, wafer holder 10 does not require a bottom electrode for generating a plasma.

In the present embodiment the wafer holder is manufactured in the method as will now be described hereinafter.

Ceramic base member 4 can be prepared by a conventional method, adding a sintering assistant to powdery ceramic, as required, and furthermore adding a binder thereto, as required, and molding and sintering the same. Ceramic base member 4 is preferably formed for example of aluminum nitride as it is highly resistant to heat and highly resistant to the corrosion attributed to a gaseous plasma containing halogen, as has been previously described.

To shape the obtained sintered compact, a known sheet forming technique is used such as doctor blade, extrusion, pressing. The sintered compact may be hot-pressed and thus densified, since, as has been described above, it should be resistant to corrosion and it is thus desirable that it contain as small an amount of a secondary component other than the aforementioned main component as possible.

The molded and dried medium is blanked or cut in a shape allowing for its degree of contraction when it is sintered. It has a shape of a disk (or an angular plate) with an angular plate (a side plate) joined to a side of the disk or angular plate, as shown in FIG. 3. The disk portion corresponds to the portion on which a wafer is placed and heated, and the side plate portion protects an extraction line supplying power to heater 1 and electrodes 2 and 3 against fluoride gas, chloride gas and the like.

After the binder is removed the medium is sintered. While desirably the medium is sintered pressurelessly, it may be sintered otherwise. The sintered compact may be polished, cut or the like, as required, or it may be used as it is if its size, warpage and the like fall within a predetermined range. On the sintered compact, heater 1, an electrode corresponding to the bottom electrode 2 for generating a plasma and that corresponding to the electrode 3 for an electrostatic chuck are formed by applying a paste containing a refractory metal such as W, Mo and the like or a mixture thereof or a heat-emission resistance substance such as Ag, Ag—Pd, Ni—Cr and the like, and removing a binder from a volatile component in the paste and then firing the sintered compact thus prepared.

While in the above description the post metalization method is applied, heater 1 and electrodes corresponding to electrodes 2 and 3 may be formed on a sheet by printing a refractory metal such as W, Mo and the like or a mixture thereof and removing a binder therefrom and then sintering the aluminum nitride and firing the refractory metal simultaneously, i.e., co-firing them.

The above-described metalized substrates or a metalized substrate and a non-metalized substrate after a bonding component is applied thereto are placed one on the other and thus bonded together. If they are used to provide a heater layer then they may be bonded together with a wire of such pyrogenic substances sandwiched therebetween. In such configuration, the heater layer desirably has as small a thickness as possible.

The adhesive component used to bond the substrates together may be determined depending on the environment in which the product is used, such as temperature, ambient gas and the like. If the product is used at relatively low temperatures the substrates may be bonded together with an organic adhesive. If the product is used at high temperatures then the substrates are preferably bonded together with an inorganic glass or nonoxide ceramic having a heat resistance higher than the temperature of interest. To reduce the thermal stress after the substrates are bonded together, the glass preferably has a thermal expansion coefficient substantially equal to that of ceramic base member 4. For example, if ceramic base member 4 contains aluminum nitride or silicon nitride as a main component thereof, it desirably has a thermal expansion coefficient of at least $3.0 \times 10^{-6}/°C$. and at most $6.0 \times 10^{-6}/°C$., and if it contains aluminum oxide or aluminum nitride oxide as a component thereof, it desirably has a thermal expansion coefficient of at least $6.0 \times 10^{-6}/°C$. and at most $8.0 \times 10^{-6}/°C$., although it depends on the temperature applied when the substrates are bonded together.

To expose an end of an extraction line to bond it to an external interconnection, either one of stacked ceramic base members 4 can have its side plate portion one side simply reduced in length. Providing a pad at an end of the interconnection facilitate bonding the interconnection.

To prevent the heat dissipating from the side plate portion from preventing the wafer holding portion from having uniform heat, preferably, as shown in FIG. 15, heater 1 has body 1A (the hatched region) reaching a portion of the side plate portion to allow the wafer holding portion to have uniform heat, and at a portion closer to the end than body 1A a groove 10A is provided as shown in FIG. 4 or the width is reduced to minimize heat dissipation.

Figure 18:
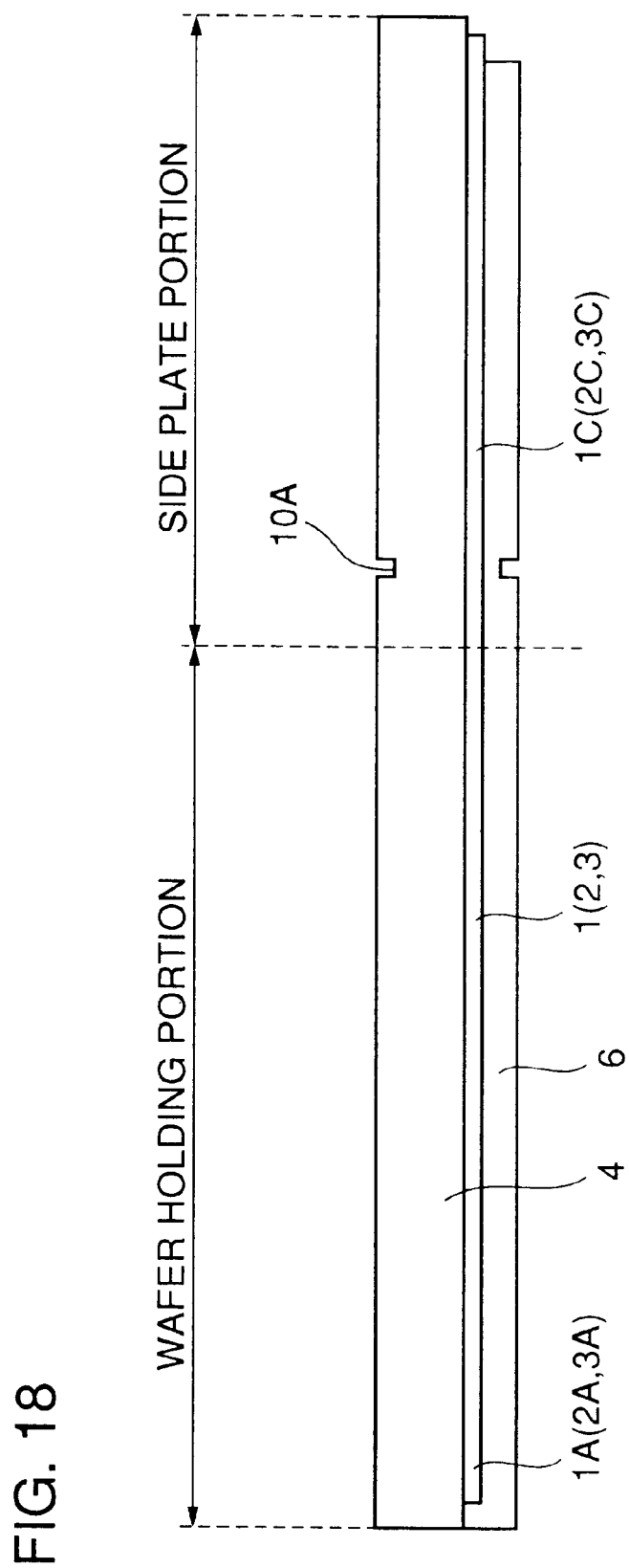
FIG. 18 is a cross sectional view showing a protection layer covering a conductive layer.
Figure 19:
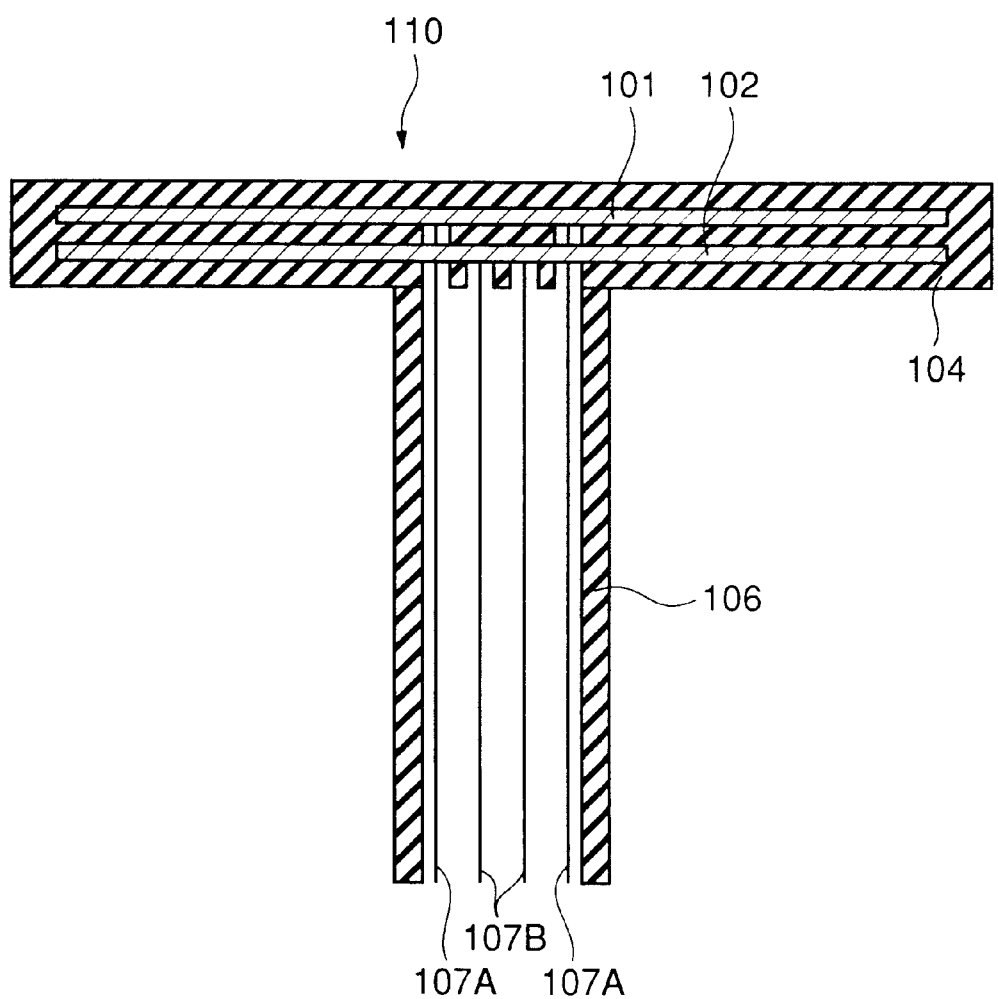
FIG. 19 is a schematic cross section showing a configuration of a conventional wafer holder.

While in the above embodiment heater 1, bottom electrode 2 and the electrode 3 for an electrostatic chuck corresponding to conductive layers are each sandwiched between a pair of ceramic base members 4, conductive layers 1, 2, 3 are not required to be sandwiched between ceramic base members 4 and as shown in FIG. 18 they may be formed on ceramic base member 4 and covered by a protection layer 6.

In the present embodiment, the conductive layer 1, 2, 3, body 1A, 2A, 3A and extraction 1C, 2C, 3C are provided in a single plane. As such, the coverage with protection layer 6 can protect conductive layers 1, 2, 3. This eliminates the necessity of providing a pipe for protecting extractions 1C, 2C, 3C, as in a conventional example. This also eliminates the necessity of providing the step of bonding the pipe and thus facilitates the fabrication and also prevents such distortion as caused in providing such pipe.

Protection layer 6 is preferably formed of a material containing at least one of glass having a thermal expansion coefficient of at least $3 \times 10^{-6}/°C$. and at most $8 \times 10^{-6}/°C$. and nonoxide ceramic having a thermal expansion coefficient of at least $3 \times 10^{31}\ ^6/°C$. and at most $6 \times 10^{-6}/°C$. Furthermore, the nonoxide ceramic is preferably formed of a material containing 50% by mass of aluminum nitride or silicon nitride.

Furthermore, if ceramic base member 4 is formed of aluminum nitride, protection layer 6 is preferably formed of a material containing an oxide containing ytterbium, neodymium and calcium or a compound producing an oxide containing ytterbium, neodymium and calcium when it is heated. Furthermore, if ceramic base member 4 is formed of silicon nitride, protection layer 6 is preferably formed of a material containing an oxide containing yttrium and aluminum or a compound producing an oxide containing yttrium and aluminum when it is heated.

Furthermore, if protection layer 6 is provided as shown in FIG. 18, ceramic base member 4 may have therein groove 4a corresponding to a hole for insertion of a temperature detection unit. Furthermore, ceramic base member 4 and protection layer 6 may each have a wafer holding portion sandwiching the body and a side plate portion extending from a side surface of the wafer holding portion and sandwiching the extraction, as shown in FIG. 18, and the side plate portion may have a width smaller than that of the wafer holding portion, as shown in FIG. 3.

Furthermore, as shown in FIG. 3, there may be an O ring 11 arranged at those side plate portions of ceramic base member 4 and protection layer 6 sandwiching the extraction. Furthermore, as shown in FIG. 18, there may also be a heat insulating recess 10A provided at the side plate portion of at least one of ceramic base member 4 and protection layer 6 sandwiching the extraction. Furthermore, as shown in FIG. 15, there may also be provided the heater 1 body at that region of the side plate portion sandwiched between ceramic base member 4 and protection layer 6.

Furthermore, if protection layer is used as shown in FIG. 18, a total thickness T1 is preferably no more than 5 mm. Furthermore, conductive layers 1, 2, 3 preferably at least have their respective bodies formed of at least one element selected from the group consisting of W, Mo, Ag, Pd, Pt, Ni and Cr. Furthermore, conductive layers 1, 2, 3 may be wire.

A result of an experiment will now be described.

FIRST EXAMPLE

Powdery aluminum nitride with 5% by mass of $Y_2O_3$ as a sintering assistant and a binder added thereto were dispersedly mixed and then doctor-blade molded so that it has a thickness of 1.0 mm when it has been sintered. After the molded medium is dried, it was blanked to provide two piece of the medium each in the form of a table-tennis racket (as shown in FIG. 3) having a disk portion (a wafer holding portion) of $\phi 300$ mm and a side plate portion of 50 mm in width and 100 mm in length when it has been sintered.

They were then degreased in a stream of nitrogen of 800° C. and sintered at 1800° C. for four hours. The obtained sintered compacts had their upper and lower surfaces polished with diamond abrasive grains. The sintered compact of aluminum nitride had a heat conductance of 175 W/mK and a thermal expansion coefficient of $4.5 \times 10^{-6}$/°C.

Powdery W and a sintering assistant were kneaded with a binder and then printed on one substrate. It was printed in a line of a W line width of 0.5 mm and a line spacing of 0.5 mm. The pattern was designed spirally provided on the disk portion and passed through the side plate portion and bonded to an external electrode. It was then degreased in nitrogen at 800° C. and baked in nitrogen at 1600° C. Furthermore, the other sintered compact was printed with powdery glass having a thermal expansion coefficient of $5.0 \times 10^{-6}$/°C. It was then degreased at 500° C. and then stacked on the sintered compact provided with the electrode. The sintered compacts stacked were then fastened with a jig made of Mo plus a weight thereon and they were thus bonded together in nitrogen at 650° C.

The wafer holder thus obtained had a configuration, a heat uniformity, a temperature drop rate, an anti-corrosion property and a heat cycle (H/C), as presented in Table 1. Table 1 also presents the results of examples 2–15 described hereinafter.

TABLE 1

| | | Configuration | | | Result | | | |
|---|---|---|---|---|---|---|---|---|
| | Metalization | Extraction line at: | Substrate thickness mm | Thermal expansion coefficient of joining glass or protection layer × $10^{-6}$/° C. | Heat uniformity ±° C. | Time for temperature to drop from 700° C. (min.) | Anti-Corrosion property | H/C result RT-800° C. |
| Examples | | | | | | | | |
| 1 AlN | W post-metalization | Side surface | 2 | 5 | 0.5 | 2 | 700° C. × 1000 h OK | ≧300 times OK |
| 2 AlN | W co-firing | Side surface | 2 | 5 | 1.0 | 2 | 700° C. × 1000 h OK | ≧300 times OK |
| 3 AlN | Ag—Pd post-metalization | Side surface | 2 | 5 | 1.5 | 4 | 700° C. × 1000 h OK | ≧300 times OK |
| 4 AlN | W post-metalization | Side surface | 2 | 2 | 0.7 | 5 | 700° C. × 1000 h OK | ≧100 times OK |
| 5 AlN | W post-metalization | Side surface | 2 | 9 | 0.5 | 4 | 700° C. × 1000 h OK | ≧100 times OK |
| 6 AlN | W post-metalization | Side surface | 6 | 5 | 0.6 | 9 | 700° C. × 1000 h OK | ≧300 times OK |
| 7 $Si_3N_4$ | W post-metalization | Side surface | 2 | 5 | 4.0 | 7 | 700° C. × 1000 h OK | ≧300 times OK |
| 8 ALON | W post-metalization | Side surface | 2 | 5 | 5.0 | 8 | 700° C. × 1000 h OK | ≧300 times OK |
| 9 $ZrO_2$ | W post-metalization | Side surface | 2 | 5 | 7.0 | 10 | NG | ≧300 times OK |
| 10 AlN | Hot press | Side surface | 4 | 5 | 9.0 | 15 | 700° C. × 1000 h OK | ≧100 times OK |
| 11 AlN | W post-metalization | Side surface | 2 | 4.5 | 2.0 | 2 | 750° C. × 1000 h OK | ≧300 times OK |
| 12 AlN | W post-metalization | Side surface | 2 | 4.5 | 2.5 | 2 | 750° C. × 1000 h OK | ≧300 times OK |
| 13 AlN | Mo | Side surface | 2 | 5 | 3.0 | 2 | 700° C. × 1000 h OK | ≧300 times OK |
| 14 AlN | Ag—Pd | Side surface | 2 | 5 | 5.0 | 2 | 700° C. × 1000 h OK | ≧300 times OK |

TABLE 1-continued

| | Configuration | | | | Result | | | |
|---|---|---|---|---|---|---|---|---|
| | | | | Thermal expansion | | | | |
| | Metalization | Extraction line at: | Substrate thickness mm | coefficient of joining glass or protection layer × $10^{-6}$/° C. | Heat uniformity ±° C. | Time for temperature to drop from 700° C. (min.) | Anti-Corrosion property | H/C result RT-800° C. |
| 15 | AlN | Ni—Cr | Side surface | 2 | 5 | 4.0 | 2 | 700° C. × 1000 h OK | ≧300 times OK |

Through an electrode terminal provided at an end of the side plate a voltage of 200V was applied to pass current to heat a surface of the disk to 700° C. The disk portion corresponding to the wafer portion had a temperature distribution of ±0.5° C. It was also exposed to fluorine gas at 700° C. for 1000 hours and it did not corrode.

Furthermore, after power-off it cooled to 30° C. or thereblow in two minutes.

Furthermore it was also subjected to a heat cycle test from a room temperature (RT) to 800° C. more than 300 times and it did not break or crack.

SECOND EXAMPLE

Powdery aluminum nitride with 5% by mass of $Y_2O_3$ and one 1% by mass of CaO added thereto as a sintering assistant and also with a binder added thereto, were dispersedly mixed and then doctor-blade molded to allow the mixture to have a thickness of 1.0 mm when it has been sintered. After the medium was dried it was blanked to provide two pieces of the medium, each in the form of a table-tennis racket having a disk portion (a wafer holding portion) of ϕ0300 mm and a side plate portion of 50 mm in width and 100 mm in length when it has been sintered.

Powdery W and a sintering assistant were kneaded with a binder and printed on one molded medium. The printed pattern is a linear pattern having a W line width of 0.5 mm and a line spacing of 0.5 mm when the molded medium has been sintered. It was designed to be spirally provided on the disk portion and passed through the side plate portion and bonded to an external electrode. Thereon the other molded medium was placed and they were thermally contact-bonded together. They were degreased in a stream of gaseous nitrogen at 800° C. and simultaneously sintered at 1800° C. for four hours. The obtained sintered compact had a heat conductance of 175 W/mK.

Through an electrode terminal provided at an end of the side plate a voltage of 200V was applied to pass current to heat a surface of the disk to 700° C. The disk portion corresponding to the wafer portion had a temperature distribution of ±1.0° C. It was also exposed to fluorine gas at 700° C. for 1000 hours and it did not corrode.

Furthermore, after power-off it cooled to 30° C. or thereblow in two minutes.

Furthermore it was also subjected to a heat cycle test from a room temperature (RT) to 800° C. not less than 300 times and did not break or crack.

THIRD EXAMPLE

The same method as employed in the first example was employed to prepare a sintered compact.

Powdery Ag—Pd and a sintering assistant were kneaded with a binder and printed on a single substrate. The printed pattern was a linear pattern having a W line width of 0.5 mm and a line spacing of 0.5 mm. It was designed to be spirally provided on the disk portion and passed through the side plate portion and bonded to an external electrode. It was degreased in the air at 500° C. and baked in nitrogen at 800° C. Furthermore the other sintered compact was printed thereon with powdery glass having a thermal expansion coefficient of $5.0 \times 10^{-6}$/°C. It was then degreased at 500° C. and then placed on the sintered compact provided with the electrode. They were then fastened by a jig made of Mo and had a weight placed thereon and were thus bonded together in nitrogen at 650° C.

Through an electrode terminal provided at an end of the side plate a voltage of 200V was applied to pass current to heat a surface of the disk to 700° C. The disk portion corresponding to the wafer portion had a temperature distribution of ±1.5° C. It was also exposed to fluorine gas at 700° C. for 1000 hours and it did not corrode.

Furthermore, after power-off it cooled to 30° C. or thereblow in four minutes.

Furthermore it was also subjected to a heat cycle test from a room temperature (RT) to 800° C. more than 300 times and did not break or crack.

FOURTH EXAMPLE

The same method as employed in the first example was employed to prepare a bonded body, except that the bonding glass used had a different thermal expansion coefficient of $2.0 \times 10^{-6}$/°C.

Through an electrode terminal provided at an end of the side plate a voltage of 200V was applied to pass current to heat a surface of the disk to 700° C. The disk portion corresponding to the wafer portion had a temperature distribution of ±0.7° C. It was also exposed to fluorine gas at 700° C. for 1000 hours and it did not corrode.

Furthermore, after power-off it cooled to 30° C. or thereblow in five minutes.

Furthermore it was subjected to a heat cycle test from a room temperature to 800° C. and it did not break or crack until the test was conducted 100 times.

FIFTH EXAMPLE

The same method as employed in the first example was employed to prepare a bonded body, except that the bonding glass used had a different thermal expansion coefficient of $9.0 \times 10^{-6}$/°C.

Through an electrode terminal provided at an end of the side plate a voltage of 200V was applied to pass current to heat a surface of the disk to 700° C. The disk portion corresponding to the wafer portion had a temperature distribution of ±0.5° C. It was also exposed to fluorine gas at 700° C. for 1000 hours and it did not corrode.

Furthermore, after power-off it cooled to 30° C. or thereblow in four minutes.

Furthermore it was subjected to a heat cycle test from a room temperature to 800° C. and it did not break or crack until the test was conducted 100 times.

SIXTH EXAMPLE

The same method as employed in the first example was employed to prepare one W metalized substrate and five non-metalized substrates. The substrates were stacked, three non-metalized substrates placed upward of the W metalized substrate and two non-metalized substrates placed downward of the W metalized substrate, and they were bonded together by the same technique as employed in the first example.

Through an electrode terminal provided at an end of the side plate a voltage of 200V was applied to pass current to heat a surface of the disk to 7000° C. The disk portion corresponding to the wafer portion had a temperature distribution of ±0.6° C. It was also exposed to fluorine gas at 7000° C. for 1000 hours and it did not corrode.

Furthermore, after power-off it cooled to 30° C. or thereblow in nine minutes.

Furthermore it was also subjected to a heat cycle test from a room temperature (RT) to 800° C. not less than 300 times and did not break or crack.

SEVENTH EXAMPLE

Powdery silicon nitride with 5% by mass of $Y_2O_3$ and 2% by mass of $Al_2O_3$ added thereto as a sintering assistant and also with a binder added thereto, were dispersedly mixed and then doctor-blade molded to allow the mixture to have a thickness of 1.0 mm when it has been sintered. After the medium was dried it was blanked to provide two pieces of the medium, each in the form of a table-tennis racket having a disk portion (a wafer holding portion) of $\phi$300 mm and a side plate portion of 50 mm in width and 100 mm in length when it has been sintered. The two pieces of the medium were degreased in a stream of gaseous nitrogen at 800° C. and sintered at 1750° C. for four hours. The obtained sintered compacts had their upper and lower surfaces polished with diamond abrasive. The obtained sintered compacts had a heat conductance of 30 W/mK and a thermal expansion coefficient of $3.0 \times 10^{-6}$/°C.

Powdery W and a sintering assistant were kneaded with a binder and printed on a single substrate. The printed pattern was a linear pattern having a W line width of 0.5 mm and a line spacing of 0.5 mm. It was designed to be spirally provided on the disk portion and passed through the side plate portion and bonded to an external electrode. It was degreased in the air at 800° C. and baked in nitrogen at 1600° C. Furthermore the other sintered compact was printed thereon with powdery glass having a thermal expansion coefficient of $5.0 \times 10^{-6}$/°C. It was then degreased at 500° C. and then placed on the sintered compact provided with the electrode. They were then fastened by a jig made of Mo and had a weight placed thereon and were thus bonded together in nitrogen at 650° C.

Through an electrode terminal provided at an end of the side plate a voltage of 200V was applied to pass current to heat a surface of the disk to 700° C. The disk portion corresponding to the wafer portion had a temperature distribution of ±4.0° C. It was also exposed to fluorine gas at 700° C. for 1000 hours and it did not corrode.

Furthermore, after power-off it cooled to 30° C. or thereblow in seven minutes.

Furthermore it was also subjected to a heat cycle test from a room temperature (RT) to 800° C. not less than 300 times and did not break or crack.

EIGHTH EXAMPLE

Powdery aluminum nitride oxide (ALON) with 2% by mass of MgO added thereto as a sintering assistant and also with a binder added thereto, were dispersedly mixed and then doctor-blade molded to allow the mixture to have a thickness of 1.2 mm when it has been sintered. After the medium was dried it was blanked to provide two pieces of the medium, each in the form of a table-tennis racket having a disk portion (a wafer holding portion) of $\phi$300 mm and a side plate portion of 50 mm in width and 100 mm in length when it has been sintered. The two pieces of the medium were degreased in a stream of gaseous nitrogen at 800° C. and sintered at 1770° C. for four hours. The obtained sintered compacts had their upper and lower surfaces polished with diamond abrasive. The obtained sintered compacts had a heat conductance of 50 W/mK and a thermal expansion coefficient of $5.0 \times 10^{-6}$/°C.

Powdery W and a sintering assistant were kneaded with a binder and printed on a single substrate. The printed pattern was a linear pattern having a W line width of 0.5 mm and a line spacing of 0.5 mm. It was designed to be spirally provided on the disk portion and passed through the side plate portion and bonded to an external electrode. It was degreased in the air at 800° C. and baked in nitrogen at 1600° C. Furthermore the other sintered compact was printed thereon with powdery glass having a thermal expansion coefficient of $5.0 \times 10^{-6}$/°C. It was then degreased at 500° C. and then placed on the sintered compact provided with the electrode. They were then fastened by a jig made of Mo and had a weight placed thereon and were thus bonded together in nitrogen at 650° C.

Through an electrode terminal provided at an end of the side plate a voltage of 200V was applied to pass current to heat a surface of the disk to 700° C. The disk portion corresponding to the wafer portion had a temperature distribution of ±5.0° C. It was also exposed to fluorine gas at 700° C. for 1000 hours and it did not corrode.

Furthermore, after power-off it cooled to 30° C. or thereblow in eight minutes.

Furthermore it was also subjected to a heat cycle test from a room temperature (RT) to 800° C. not less than 300 times and did not break or crack.

NINTH EXAMPLE

Powdery $ZrO_2$ with 2% by mass of $Y_2O_3$ and 1% by mass of CaO added thereto as a sintering assistant and also with a binder added thereto, were dispersedly mixed and then doctor-blade molded to allow the mixture to have a thickness of 1.0 mm when it has been sintered. After the medium was dried it was blanked to provide two pieces of the medium, each in the form of a table-tennis racket having a disk portion (a wafer holding portion) of $\phi$300 mm and a side plate portion of 50 mm in width and 100 mm in length when it has been sintered. The two pieces of the medium were degreased in a stream of gaseous nitrogen at 800° C. and sintered at 1450° C. for four hours. The obtained sintered compacts had their upper and lower surfaces polished with diamond abrasive. The obtained sintered compacts had a heat conductance of 10 W/mK and a thermal expansion coefficient of $8.5 \times 10^{-6}$/°C.

Powdery W and a sintering assistant were kneaded with a binder and printed on a single substrate. The printed pattern was a linear pattern having a W line width of 0.5 mm and a line spacing of 0.5 mm. It was designed to be spirally provided on the disk portion and passed through the side plate portion and bonded to an external electrode. It was degreased in nitrogen at 800° C. and baked in nitrogen at 1600° C. Furthermore the other sintered compact was printed thereon with powdery glass having a thermal expansion coefficient of $5.0 \times 10^{-6}$/°C. It was then degreased at 500° C. and then placed on the sintered compact provided with the electrode. They were then fastened by a jig made of Mo and had a weight placed thereon and were thus bonded together in nitrogen at 650° C.

Through an electrode terminal provided at an end of the side plate a voltage of 200V was applied to pass current to heat a surface of the disk to 700° C. The disk portion corresponding to the wafer portion had a temperature distribution of ±7.0° C.

Furthermore, after power-off it cooled to 30° C. or therebelow in ten minutes.

Furthermore it was also subjected to a heat cycle test from a room temperature (RT) to 800° C. not less than 300 times and did not break or crack.

TENTH EXAMPLE

Powdery aluminum nitride with 5% by mass of $Y_2O_3$ added thereto as a sintering assistant and also with a binder added thereto, were dispersedly mixed and dried and then pressed with a die and thus molded to provide two pieces of the mixture, each in the form of a table-tennis racket having a disk portion (a wafer holding portion) of $\phi$300 mm and a side plate portion of 50 mm in width and 100 mm in length when it has been sintered. Each medium was provided with a spiral groove at a depth of 0.5 mm with a width of 1.5 mm at a pitch of 2 mm. The two molded media have their respective spiral patterns running in opposite directions and when they are registered their spiral patterns match. One molded medium had Mo of 0.5 mm$\phi$ and having a coil winding diameter of 1.0 mm$\phi$ and buried in and thus spirally running along its groove and thereon the other molded medium is placed and they were thus hot-pressed and thus sintered at 1850° C. to provide a sintered compact having a thickness of 4 mm. The sintered compact had a heat conductance of 173 W/mK and a thermal expansion coefficient of $4.5 \times 10^{-6}$/°C.

Through an electrode terminal provided at an end of the side plate a voltage of 200V was applied to pass current to heat a surface of the disk to 700° C. The disk portion corresponding to the wafer portion had a temperature distribution of ±9.0° C. It was also exposed to fluorine gas at 7000° C. for 1000 hours and it did not corrode.

Furthermore, after power-off it cooled to 30° C. or therebelow in 15 minutes.

Furthermore it was subjected to a heat cycle test from a room temperature to 800° C. and it did not break or crack until the test was conducted 100 times.

ELEVENTH EXAMPLE

The same method as employed in the first example was employed to prepare one W metalized substrate and one non-metalized substrate. With the W metalized substrate interposed, the non-metalized substrate is stacked, and a layer of AlN with Y—Ca—O added thereto by 3% was applied thereto and the substrates were stacked together and thus sintered in $N_2$ at 1600° C. and thus bonded together. The metalization had its back surface regarded as a wafer holding surface and heated and the wafer holding surface had a temperature of 700° C.±2.0° C. It was also exposed to fluorine gas at 750° C. for 1000 hours and it did not corrode.

Furthermore, after power-off it cooled to 30° C. or therebelow in two minutes.

Furthermore it was also subjected to a heat cycle test from a room temperature (RT) to 800° C. and did not break or crack until the test was conducted 300 times.

TWELFTH EXAMPLE

The same method as employed in the first example was employed to prepare a single W metalized substrate. A paste of AlN with Yb—Nd—Ca—O added thereto by 3% was applied to the substrate and thus sintered in $N_2$ at 1600° C. to provide a protection layer. The metalization had its back surface regarded as a wafer holding surface and heated and the wafer holding surface had a temperature of 700° C.±2.5° C. It was also exposed to fluorine gas at 750° C. for 1000 hours and it did not corrode.

Furthermore, after power-off it cooled to 30° C. or therebelow in two minutes.

Furthermore it was also subjected to a heat cycle test from a room temperature (RT) to 800° C. and did not break or crack until the test was conducted 300 times.

THIRTEENTH EXAMPLE

The same method as employed in the first example was employed to prepare two sintered compacts. The same conditions as applied in the first example were applied to prepare a wafer holder, except that on one sintered compact a paste of Mo was applied in a linear pattern having a width of 0.5 mm and a spacing of 0.5 mm and it was thus baked in nitrogen ($N_2$) to provide a conductive layer. On the wafer holder a wafer had its surface temperature distribution measured under the same conditions as in the first example and it had a temperature of 700° C.±3° C. Furthermore it was exposed to fluorine gas at 700° C. for 1000 hours and it did not corrode.

Furthermore, after power-off it cooled to 30° C. or therebelow in two minutes.

Furthermore it was also subjected to a heat cycle test from a room temperature (RT) to 800° C. and did not break or crack until the test was conducted 300 times.

FOURTEENTH EXAMPLE

The same method as employed in the first example was employed to prepare two sintered compacts. The same conditions as applied in the first example were applied to prepare a wafer holder, except that on one sintered compact a paste of Ag—Pd was applied in a linear pattern having a width of 0.5 mm and a spacing of 0.5 mm and it was thus baked in nitrogen ($N_2$) to provide a conductive layer. On the wafer holder a wafer had its surface temperature distribution measured under the same conditions as in the first example and it had a temperature of 700° C.±5° C. Furthermore it was exposed to fluorine gas at 700° C. for 1000 hours and it did not corrode.

Furthermore, after power-off it cooled to 30° C. or therebelow in two minutes.

Furthermore it was also subjected to a heat cycle test from a room temperature (RT) to 800° C. and did not break or crack until the test was conducted 300 times.

FIFTEENTH EXAMPLE

The same method as employed in the first example was employed to prepare two sintered compacts. The same conditions as applied in the first example were applied to prepare a wafer holder, except that on one sintered compact a paste of Ni—Cr was applied in a linear pattern having a width of 0.5 mm and a spacing of 0.5 mm and it was thus baked in nitrogen ($N_2$) to provide a conductive layer. On the wafer holder a wafer had its surface temperature distribution measured under the same conditions as in the first example and it had a temperature of 700° C.±4° C. Furthermore it was exposed to fluorine gas at 700° C. for 1000 hours and it did not corrode.

Furthermore, after power-off it cooled to 30° C. or thereblow in two minutes.

Furthermore it was also subjected to a heat cycle test from a room temperature (RT) to 800° C. and did not break or crack until the test was conducted 300 times.

SIXTEENTH TO TWENTIETH EXAMPLES

The same method as employed in the first example was employed to prepare one sintered compact and one W metalized substrate having a linear pattern of W having a width of 0.5 mm and a spacing of 0.5 mm. Glass having coefficients of thermal expansion of $2.5 \times 10^{-6}/°C.$, $3.0 \times 10^{-6}/°C.$, $5.0 \times 10^{-6}/°C.$, $7.9 \times 10^{-6}/°C.$, $10 \times 10^{-6}/°C.$ were employed to bond the sintered compact and the W metalized substrate together in nitrogen $N_2$ at 700° C. With a targeted temperature elevation rate within no more than 30 minutes/60° C., as provided in Table 2, example 16 broke in 35 minutes, example 17 broke in six minutes, example 18 did not break within six minutes, example 19 broke in eight minutes and example 20 broke in 80 minutes.

TABLE 2

Targeted temperature elevation rate ≦30 minutes/600° C.

| No. | Thermal expansion coefficient × $10^{-6}/°$ C. | Temperature elevation rate min./600° C. | Results |
|---|---|---|---|
| Example 16 | 2.5 | 35 | Broken |
| Example 17 | 3 | 6 | Broken |
| Example 18 | 5 | ≦6 | Not Broken |

TABLE 2-continued

Targeted temperature elevation rate ≦30 minutes/600° C.

| No. | Thermal expansion coefficient × $10^{-6}/°$ C. | Temperature elevation rate min./600° C. | Results |
|---|---|---|---|
| Example 19 | 7.9 | 8 | broken |
| Example 20 | 10 | 80 | broken |

First Comparative Example

Powdery aluminum nitride with 5% by mass of $Y_2O_3$ added thereto as a sintering assistant and also with a binder added thereto, were dispersedly mixed and dried and then pressed with a die and thus molded to provide two pieces of the mixture, each in the form of a disk of ϕ0300 mm×5 mmt when it has been sintered. Each molded medium was provided thereon with Mo of 0.5 mmϕ having a coil winding diameter of 5 mmϕ spirally with a pitch of 10 mm and it was thus hot-pressed and thus sintered at 1850° C. The sintered compact obtained had a heat conductance of 173 W/mK and a thermal expansion coefficient of $4.5 \times 10^{-6}/°C.$ A pipe of aluminum nitride of 80 mmϕ having a thickness of 5 mm was diffusingly bonded on a back side of the disk. A wire made of Mo was passed through the pipe and silver-soldered to an electrode terminal of a Mo coil.

Through an electrode terminal a voltage of 200V was applied to pass current to heat a surface of the disk to 700° C. The disk portion corresponding to the wafer portion had a temperature distribution of ±12.0° C. It was also exposed to fluorine gas at 750° C. for 1000 hours and it did not corrode.

Furthermore, after power-off it cooled to 30° C. or thereblow in 40 minutes.

Furthermore, it was subjected to a heat cycle test from a room temperature to 800° C. and the pipe's bonded portion cracked when the test was conducted 75 times.

Table 3 presents the configuration, heat uniformity, temperature reduction rate, anti-corrosion property and heat cycle (H/C) of the obtained wafer holder. Table 3 also presents those of second and third comparative examples described hereinafter.

TABLE 3

| | | | Configuration | | | Result | | | |
|---|---|---|---|---|---|---|---|---|---|
| | | | | | | | Time for | | |
| | Metalization | Extraction line at: | | Substrate thickness mm | Thermal expansion coefficient of joining glass × $10^{-6}/°$ C. | Heat uniformity ±° C. | temperature to drop from 700° C. (min.) | Anti-Corrosion property | H/C result RT-800° C. |
| Comparative examples | | | | | | | | | |
| 1 | AlN | W coil/HP | Pipe (ϕ80 thickness 2) back side diffusingly bonded | 10 | — | 12.0 | 40 | 750° C. × 1000 h OK | Pipe's bonded portion slightly cracked for 75 cycles |
| 2 | AlN | W post-metalization | Pipe (ϕ80 thickness 2) back side glass bonded | 2 | 5 | 10.0 | 20 | 700° C. × 1000 h OK | Pipe's bonded portion cracked for 90 cycles |
| 3 | AlN | W post-metalization | Metal pipe (ϕ80 thickness 2) back side soldered | 2 | 5 | 10.0 | 25 | 700° C. × 1000 h OK | Broken after bonded before H/C |

Second Comparative Example

Powdery aluminum nitride with 5% by mass of $Y_2O_3$ added thereto as a sintering assistant and also with a binder added thereto, were dispersedly mixed and then doctor-blade molded to allow the mixture to have a thickness of 1.0 mm when it has been sintered. After the medium was dried it was blanked to provide two pieces of the medium, each in the form of a disk of $\phi$300 mm when it has been sintered. The two pieces of the medium were degreased in a stream of gaseous nitrogen at 800° C. and sintered at 1800° C. for four hours. The obtained sintered compacts had their upper and lower surfaces polished with diamond abrasive. The obtained sintered compacts had a heat conductance of 175 W/mK and a thermal expansion coefficient of $4.5 \times 10^{-6}$/°C.

Powdery W and a sintering assistant were kneaded with a binder and printed on a single substrate. The printed pattern was a linear pattern having a W line width of 0.6 mm and a line spacing of 0.5 mm. It was spirally provided on the disk portion and patterned to allow an electrode terminal to be positioned at the center on the back side. Glass having a thermal expansion coefficient of $5.0 \times 10^{-6}$/°C. was used to bond a pipe of 80 mm$\phi$ having a thickness of 5 mm to a back side of the disk. A wire made of Mo was passed through the pipe and silver-soldered to an electrode terminal of the W metalization.

Through an electrode terminal a voltage of 200V was applied to pass current to heat a surface of the disk to 700° C. The disk portion corresponding to the wafer portion had a temperature distribution of ±10.0° C. It was also exposed to fluorine gas at 700° C. for 1000 hours and it did not corrode.

Furthermore, after power-off it cooled to 30° C. or thereblow in 20 minutes.

Furthermore, it was subjected to a heat cycle test from a room temperature to 800° C. and the pipe's bonded portion cracked when the test was conducted 90 times.

Third Comparative Example

The same method as employed in the second comparative example was employed to prepare a disk bonded body.

A pipe made of SUS310 of 80 mm$\phi$ having a thickness of 5 mm was silver-soldered and thus bonded to a back side of a disk and simultaneously a wire made of Mo was passed through the pipe and silver-soldered to an electrode terminal of the W metalization.

Through an electrode terminal a voltage of 200V was applied to pass current to heat a surface of the disk to 700° C. The disk portion corresponding to the wafer portion had a temperature distribution of ±10.0° C. It was also exposed to fluorine gas at 700° C. for 1000 hours and it did not corrode.

Furthermore, after power-off it cooled to 30° C. or therebelow in 25 minutes.

Furthermore, the disk of aluminum nitride and the pipe's bonded portion cracked when the wafer holder was cooled as described above only once.

Thus, the present invention in one and another aspect provides a wafer holder for a semiconductor manufacturing apparatus that has a conductive layer having a body and an extraction substantially provided in a single plane to allow the body and the extraction to be sandwiched by paired ceramic base members and thus protected or to be covered by a protection layer to protect the conductive layer. This can eliminate the necessity of using a pipe to protect the extraction, as conventional. Thus, the step of bonding the pipe can be dispensed with to facilitate producing the wafer holder and also allow the wafer holder to be free of such distortion as attributed to installing the pipe.

As such, as a wafer holder of a semiconductor manufacturing apparatus for etching, deposition and the like that is increased in diameter and required to uniformly heat a wafer, there can be manufactured a product also functioning as both a heater and an electrostatic chuck as well as achieving high heat uniformity, having less warpage and being inexpensive and significantly suitable for mass-production.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer holder for a semiconductor manufacturing apparatus including an enclosed processing chamber in which said wafer holder is arranged, said wafer holder comprising a conductive layer and a pair of ceramic base members sandwiching said conductive layer therebetween, wherein:

said conductive layer has a body arranged at a surface opposite a wafer holding surface of one of said ceramic base members and an extension protruding from said body outwardly from the chamber to outside of the chamber for enabling an external electrical connection with said extension; and said body and said extension are arranged substantially in a single plane.

2. The wafer holder for a semiconductor manufacturing apparatus according to claim 1, wherein said ceramic base members are formed of at least one material selected from the group consisting of aluminum nitride, silicon nitride, aluminum nitride oxide and aluminum oxide.

3. The wafer holder for a semiconductor manufacturing apparatus according to claim 2, wherein said ceramic base members have a heat conductance of no less than 100 W/mK.

4. The wafer holder for a semiconductor manufacturing apparatus according to claim 1, wherein between said conductive layer and said one ceramic base member there is an intermediate layer formed of a material including at least one of glass having a thermal expansion coefficient of at least $3 \times 10^{-6}$/°C. and at most $8 \times 10^{-6}$/°C. and nonoxide ceramic having a thermal expansion coefficient of at least $3 \times 10^{-6}$/°C. and at most $6 \times 10^{-6}$/°C.

5. The wafer holder for a semiconductor manufacturing apparatus according to claim 4, wherein said nonoxide ceramic contains at least 50% by mass of aluminum nitride or silicon nitride.

6. The wafer holder for a semiconductor manufacturing apparatus according to claim 4, wherein said intermediate layer is formed of a material including an oxide containing ytterbium, neodymium and calcium or a compound producing an oxide containing ytterbium, neodymium and calcium when heat treatment is performed.

7. The wafer holder for a semiconductor manufacturing apparatus according to claim 4, wherein said intermediate layer is formed of a material including an oxide containing yttrium and aluminum or a compound producing an oxide containing yttrium and aluminum when heat treatment is performed.

8. The wafer holder for a semiconductor manufacturing apparatus according to claim 1, wherein at least one of said ceramic base members is provided therein with a hole for arranging a temperature detection unit therein.

9. The wafer holder for a semiconductor manufacturing apparatus according to claim 1, wherein said pair of ceramic base members comprise respective wafer holding portions sandwiching said body therebetween and respective side plate portions each extending respectively from a side surface of said respective wafer holding portion, together sandwiching said extension therebetween and having a width smaller than a width of said wafer holding portion.

10. The wafer holder for a semiconductor manufacturing apparatus according to claim 9, wherein a portion of said body protrudes into and forms a heater in a region sandwiched between said side plate portions of said pair of ceramic base members.

11. The wafer holder for a semiconductor manufacturing apparatus according to claim 9, further comprising an O-ring arranged on and extending around said side plate portions of said pair of ceramic base members sandwiching said extension therebetween.

12. The wafer holder for a semiconductor manufacturing apparatus according to claim 9, wherein a heat insulating neck is provided in at least one of said side plate portions of said pair of ceramic base members sandwiching said extension therebetween.

13. The wafer holder for a semiconductor manufacturing apparatus according to claim 1, wherein said conductive layer at at least said body is formed of a material formed of at least one element selected from the group consisting of W, Mo, Ag, Pd, Pt, Ni and Cr.

14. The wafer holder for a semiconductor manufacturing apparatus according to claim 1, wherein said conductive layer is any one of a heater, an electrode for generating a plasma and an electrode for an electrostatic chuck.

15. The wafer holder for a semiconductor manufacturing apparatus according to claim 1, having a total thickness of no more than 5 mm.

16. The wafer holder for a semiconductor manufacturing apparatus according to claim 15, wherein said conductive layer is a wire.

17. A semiconductor manufacturing apparatus incorporating therein the wafer holder for a semiconductor manufacturing apparatus as recited in claim 1.

18. The semiconductor manufacturing apparatus according to claim 17, being any one of an etching apparatus, a chemical vapor deposition apparatus and a plasma chemical vapor deposition apparatus.

19. A wafer bolder for a semiconductor manufacturing apparatus including an enclosed processing chamber in which said wafer holder is arranged, said wafer holder comprising a ceramic base member, a conductive layer provided on said ceramic base member and a protection layer covering said conductive layer, wherein:

said conductive layer has a body arranged at a surface opposite a wafer holding surface of said ceramic base member and an extension protruding from said body outwardly from the chamber to outside of the chamber for enabling an external electrical connection with said extension; and said body and said extension are arranged substantially in a single plane.

20. The wafer holder for a semiconductor manufacturing apparatus according to claim 19, wherein said ceramic base member is formed of at least one material selected from the group consisting of aluminum nitride, silicon nitride, aluminum nitride oxide and aluminum oxide.

21. The wafer holder for a semiconductor manufacturing apparatus according to claim 20, wherein said ceramic base member has a heat conductance of no less than 100 W/mK.

22. The wafer holder for a semiconductor manufacturing apparatus according to claim 19, wherein said protection layer is formed of a material including at least one of glass having a thermal expansion coefficient of at least $3 \times 10^{-6}/°C$. and at most $8 \times 10^{-6}/°C$. and nonoxide ceramic having a thermal expansion coefficient of at least $3 \times 10^{-6}/°C$. and at most $6 \times 10^{-6}/°C$.

23. The wafer holder for a semiconductor manufacturing apparatus according to claim 22, wherein said nonoxide ceramic contains at least 50% by mass of aluminum nitride or silicon nitride.

24. The wafer holder for a semiconductor manufacturing apparatus according to claim 22, wherein said protection layer is formed of a material including an oxide containing ytterbium, neodymium and calcium or a compound producing an oxide containing ytterbium, neodymium and calcium when heat treatment is performed.

25. The wafer holder for a semiconductor manufacturing apparatus according to claim 22, wherein said protection layer is formed of a material including an oxide containing yttrium and aluminum or a compound producing an oxide containing yttrium and aluminum when heat treatment is performed.

26. The wafer holder for a semiconductor manufacturing apparatus according to claim 19, wherein said ceramic base member is provided therein with a hole for arranging a temperature detection unit therein.

27. The wafer holder for a semiconductor manufacturing apparatus according to claim 19, wherein said conductive layer at at least said body is formed of a material formed of at least one element selected from the group consisting of W, Mo, Ag, Pd, Pt, Ni and Cr.

28. The wafer holder for a semiconductor manufacturing apparatus according to claim 19, wherein said conductive layer is any one of a heater, an electrode for generating a plasma and an electrode for an electrostatic chuck.

29. The wafer holder for a semiconductor manufacturing apparatus according to claim 19, having a total thickness of no more than 5 mm.

30. The wafer holder for a semiconductor manufacturing apparatus according to claim 29, wherein said conductive layer is a wire.

31. The wafer holder for a semiconductor manufacturing apparatus according to claim 19, wherein said ceramic base member and said protection layer comprise respective wafer holding portions sandwiching said body therebetween and respective side plate portions each extending respectively from a side surface of said respective wafer holding portion, together sandwiching said extension therebetween and having a width smaller than a width of said wafer holding portion.

32. The wafer holder for a semiconductor manufacturing apparatus according to claim 31, further comprising an O-ring arranged on and extending around said side plate portion of said ceramic base member and said side plate portion of said protection layer together sandwiching said extension therebetween.

33. The wafer holder for a semiconductor manufacturing apparatus according to claim 31, wherein a heat insulating neck is provided in at least one of said side plate portion of said ceramic base member and said side plate portion of said protection layer together sandwiching said extension therebetween.

34. The wafer holder for a semiconductor manufacturing apparatus according to claim 31, wherein a portion of said body protrudes into and forms a heater in a region sandwiched between said side plate portion of said ceramic base member and said side plate portion of said protection layer.

35. A semiconductor manufacturing apparatus incorporating therein the wafer holder for a semiconductor manufacturing apparatus as recited in claim 19.

36. The semiconductor manufacturing apparatus according to claim 35, being any one of an etching apparatus, a chemical vapor deposition apparatus and a plasma chemical vapor deposition apparatus.

37. A semiconductor manufacturing apparatus comprising:

a vacuum chamber; and a wafer holder comprising a first ceramic base member and a first electrically conductive member;

wherein:

said ceramic base member includes a wafer holding portion and a lateral protruding plate portion that protrudes laterally from said wafer holding portion along a common plane therewith;

said wafer holding portion has a wafer holding surface adapted to support a semiconductor wafer thereon, and a back surface opposite said wafer holding surface;

said electrically conductive member integrally includes a conductive body arranged on said back surface of said wafer holding portion of said ceramic base member, and a conductive extension protruding integrally laterally from said conductive body along said lateral protruding plate portion on a common plane with said conductive body; and said wafer holding portion of said ceramic base member and said conductive body of said electrically conductive member are arranged in said vacuum chamber, and said protruding plate portion of said ceramic base member and said conductive extension of said electrically conductive member protrude laterally outwardly out of said vacuum chamber, enabling an electrical connection to be made with said conductive extension outside of said vacuum chamber.

38. The semiconductor manufacturing apparatus according to claim 37, wherein said ceramic base member includes only one said lateral protruding plate portion that protrudes in only one lateral direction from only one side of said wafer, holding portion, said electrically conductive member includes only one said conductive extension that protrudes in only said one lateral direction from only one side of said conductive body, and an end of said conductive extension protruding out of said vacuum chamber in said one lateral direction includes all electrical contacts of said electrically conductive member that are necessary for electrically connecting said electrically conductive member outside of said vacuum chamber.

39. The semiconductor manufacturing apparatus according to claim 37, wherein said wafer holder further comprises a second ceramic base member that is arranged with said first electrically conductive member sandwiched between said first and second ceramic base members, wherein said second ceramic base member protrudes laterally outwardly from said vacuum chamber a smaller distance than said lateral protruding plate portion of said first ceramic base member and said conductive extension, so as to form a stepped end that leaves an end contact portion of said conductive extension unsandwiched and exposed by said second ceramic base member.

40. The semiconductor manufacturing apparatus according to claim 39, wherein said wafer holder further comprises a third ceramic base member, and a second electrically conductive member sandwiched between said second and third ceramic base members, wherein said third ceramic base member protrudes laterally outwardly from said vacuum chamber a smaller distance than said second ceramic base member and said second electrically conductive member, so as to form another step of said stepped end that leaves an end contact portion of said second electrically conductive member unsandwiched and exposed by said third ceramic base member.

41. The semiconductor manufacturing apparatus according to claim 37, wherein said wafer holder further comprises a protective layer covering said electrically conductive member on a surface thereof opposite said ceramic base member.

42. The semiconductor manufacturing apparatus according to claim 37, further comprising an O-ring that extends and forms a seal around said lateral protruding plate portion and said conductive extension as said lateral protruding plate portion and said conductive extension extend laterally outwardly through an opening in a wall of said vacuum chamber.

* * * * *

UNITED STATES PATENT AND TRADEMARK OFFICE
CERTIFICATE OF CORRECTION

PATENT NO. : 6,554,906 B1
DATED : April 29, 2003
INVENTOR(S) : Kuibira et al.

It is certified that error appears in the above-identified patent and that said Letters Patent is hereby corrected as shown below:

Column 4,
Line 21, after "pair", delete "rap".

Column 12,
Line 50, after "least", replace "$3 \times 10^{31\ 6}/°C.$" by -- $3 \times 10^{-6}/°C.$ --.

Column 14,
Line 21, after "of", replace "$5 \times 10\text{-}6/°C.$" by -- $5 \times 10^{-6}/°C.$ --.

Column 13 and 15,
Table 1, under "Examples", all instances, replace "AIN" by -- AlN --.

Column 15,
Line 21, before "in", replace "blow" by -- below --;
Line 35, after "of", replace "ϕ 0300 mm" by -- ϕ300 mm --;

Column 19,
Lines 20 and 53, before "in", replace "blow" by -- below --;

Column 20,
Lines 5, 21, 41 and 60, before "in", replace "blow" by -- below --;

Column 21,
Line 14, before "in", replace "blow" by -- below --;
Line 27, before ",", (1st occurrence), delete "$_6/°C$".

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,554,906 B1
DATED         : April 29, 2003
INVENTOR(S)   : Kuibira et al.

It is certified that error appears in the above-identified patent and that said Letters Patent is hereby corrected as shown below:

<u>Column 21,</u>
Line 26, after ",", replace "3.0×10⁻", by -- 3x.0x10⁻⁶/°C., --;

<u>Column 22,</u>
Line 18, after "mmx5", replace "mmt" by -- mmφ --;
Line 37, before "in", replace "blow" by -- below --.
TABLE 3, under "<u>Comparative examples</u>" all instances, replace "AIN" by -- AlN --.

<u>Column 23,</u>
Line 34, before "in", replace "blow" by -- below --.

Signed and Sealed this

Twenty-eighth Day of October, 2003

JAMES E. ROGAN
*Director of the United States Patent and Trademark Office*